(12) United States Patent
Edo et al.

(10) Patent No.: US 7,670,754 B2
(45) Date of Patent: Mar. 2, 2010

(54) EXPOSURE APPARATUS HAVING A PROCESSING CHAMBER, A VACUUM CHAMBER AND FIRST AND SECOND LOAD LOCK CHAMBERS

(75) Inventors: Ryo Edo, Utsunomiya (JP); Masami Yonekawa, Utsunomiya (JP); Shinichi Hara, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1128 days.

(21) Appl. No.: 11/001,116

(22) Filed: Dec. 2, 2004

(65) Prior Publication Data
US 2005/0121144 A1 Jun. 9, 2005

(30) Foreign Application Priority Data
Dec. 3, 2003 (JP) .............................. 2003-404023

(51) Int. Cl.
*H01L 21/00* (2006.01)
*G03F 7/00* (2006.01)
*G03B 27/42* (2006.01)

(52) U.S. Cl. .................. 430/311; 430/302; 134/85; 134/902; 250/492.1; 355/67; 156/345.32; 414/940

(58) Field of Classification Search .................. 430/311, 430/302; 156/345.32; 414/940; 355/67; 250/492.1; 134/85, 902
See application file for complete search history.

(56) References Cited

U.S. PATENT DOCUMENTS

| 4,718,975 | A * | 1/1988 | Bowling et al. | 204/298.11 |
|---|---|---|---|---|
| 5,746,562 | A | 5/1998 | Hasegawa et al. | 414/217 |
| 5,820,679 | A | 10/1998 | Yokoyama et al. | 178/719 |
| 5,858,863 | A | 1/1999 | Yokoyama et al. | 438/514 |
| 5,914,493 | A | 6/1999 | Morita et al. | 250/492.2 |
| 6,038,015 | A * | 3/2000 | Kawata | 355/67 |
| 6,099,598 | A | 8/2000 | Yokoyama et al. | 29/25.01 |
| 6,406,245 | B2 | 6/2002 | Hasegawa et al. | 414/217 |
| 6,714,277 | B2 | 3/2004 | Hara et al. | 355/30 |

(Continued)

FOREIGN PATENT DOCUMENTS

JP 6-110197 4/1994

(Continued)

OTHER PUBLICATIONS

Derwent-ACC-No. 1982-93710E.*

*Primary Examiner*—Thorl Chea
(74) *Attorney, Agent, or Firm*—Fitzpatrick, Cella, Harper & Scinto

(57) ABSTRACT

An exposure apparatus for executing an exposure of a substrate to light via a mask. The apparatus includes a booth which stores the mask in an atmospheric pressure, a processing chamber in which the exposure is executed in a first vacuum pressure, a vacuum chamber, arranged between the booth and the processing chamber, stores the mask at a second vacuum pressure that is higher than the first vacuum pressure and is between 0.1 Pa and 100 Pa, a first load lock chamber, arranged between the booth and the vacuum chamber, through which the mask is transferred, in which the atmospheric pressure and the second vacuum pressure are replaceable, and a second load lock chamber arranged between the vacuum chamber and the processing chamber, through which the mask is transferred, in which the second vacuum pressure and the first vacuum pressure are replaceable.

14 Claims, 16 Drawing Sheets

U.S. PATENT DOCUMENTS

| | | |
|---|---|---|
| 6,750,946 B2 | 6/2004 | Tanaka et al. .................. 355/30 |
| 6,805,748 B1 * | 10/2004 | Edo ............................ 118/719 |
| 6,842,221 B1 * | 1/2005 | Shiraishi ...................... 355/30 |
| 7,236,229 B2 * | 6/2007 | Edo ............................ 355/53 |
| 2001/0023522 A1 | 9/2001 | Watson et al. .............. 29/25.01 |
| 2001/0027351 A1 | 10/2001 | Takeuchi et al. ............. 700/121 |
| 2001/0028443 A1 | 10/2001 | Yabu ............................ 355/30 |
| 2001/0035942 A1 | 11/2001 | Hara et al. .................... 355/30 |
| 2001/0041119 A1 | 11/2001 | Hasegawa et al. ........... 414/217 |
| 2001/0055326 A1 | 12/2001 | Miwa et al. .................... 372/57 |
| 2002/0002946 A1 | 1/2002 | Tanaka et al. ................ 118/719 |
| 2002/0011207 A1 | 1/2002 | Uzawa et al. ................. 118/666 |
| 2002/0020344 A1 * | 2/2002 | Takano ....................... 118/100 |
| 2002/0071105 A1 | 6/2002 | Miwa ............................ 355/53 |
| 2002/0134947 A1 * | 9/2002 | Van Schaik ................ 250/492.1 |
| 2003/0015290 A1 | 1/2003 | Edo ...................... 156/345.27 |
| 2003/0021671 A1 | 1/2003 | Edo ............................ 414/939 |
| 2003/0147058 A1 | 8/2003 | Murakami et al. ............. 355/53 |
| 2004/0187786 A1 | 9/2004 | Tanaka et al. ............... 118/719 |

FOREIGN PATENT DOCUMENTS

| | | |
|---|---|---|
| JP | 6-196390 | 7/1994 |
| JP | 6-338446 | 12/1994 |
| JP | 7-86156 | 3/1995 |
| JP | 7-122622 | 5/1995 |
| JP | 7-142374 | 6/1995 |
| JP | 7-254556 | 10/1995 |
| JP | 9-45756 | 2/1997 |
| JP | 10-92724 | 4/1998 |
| JP | 10-233423 | 9/1998 |
| JP | 11-26370 | 1/1999 |
| JP | 2000-123111 | 4/2000 |
| JP | 2000-228354 | 8/2000 |
| JP | 2000-349005 | 12/2000 |
| JP | 2000-353649 | 12/2000 |
| JP | 2001-15432 | 1/2001 |
| JP | 2001-85290 | 3/2001 |
| JP | 2001-102281 | 4/2001 |
| JP | 2001-210576 | 8/2001 |
| JP | 2001-267200 | 9/2001 |
| JP | 2001-267237 | 9/2001 |
| JP | 2001-284211 | 10/2001 |
| JP | 2001-284213 | 10/2001 |
| JP | 2001-284218 | 10/2001 |
| JP | 2001-345262 | 12/2001 |
| JP | 2002-15989 | 1/2002 |
| JP | 2002-25890 | 1/2002 |
| JP | 2002-57100 | 2/2002 |
| JP | 2002-100566 | 4/2002 |
| JP | 2002-158155 | 5/2002 |
| JP | 2002-303695 | 10/2002 |
| JP | 2003-31639 | 1/2003 |
| JP | 2003-45947 | 2/2003 |
| JP | 2003-227898 | 8/2003 |
| JP | 2003-234268 | 8/2003 |
| WO | WO 95/06900 | 3/1995 |

* cited by examiner

SCANNING PATTERN OF STAGE

IRRADIATING CONDITION OF PULSED LASER LIGHT ON MASK M

IRRADIATING CONDITION OF PULSED LASER LIGHT ON MASK M

AREA THAT LASER LIGHT DOES NOT IRRADIATE INTO

SCANNING PATTERN OF PULSED LASER LIGHT

IRRADIATING CONDITION OF PULSED LASER LIGHT ON MASK M

IRRADIATING CONDITION OF PULSED LASER LIGHT ON MASK M

AREA THAT LASER LIGHT DOES NOT IRRADIATE INTO

US 7,670,754 B2

EXPOSURE APPARATUS HAVING A PROCESSING CHAMBER, A VACUUM CHAMBER AND FIRST AND SECOND LOAD LOCK CHAMBERS

This application claims the right of priority under 35 U.S.C. §119 based on Japanese Patent Application No. 2003-404023, filed on Dec. 3, 2003, which is hereby incorporated by reference herein in its entirety as if fully set forth herein.

BACKGROUND OF THE INVENTION

The present invention relates generally to an exposure apparatus, and, more particularly, a processing system for transporting an object, such as a mask, a semiconductor chip or a liquid crystal display substrate, etc., from a supplying part to a processing chamber for executing an exposure process in a fabricating process of the semiconductor chip or the liquid crystal display substrate, etc.

In manufacturing such fine semiconductor devices as a semiconductor memory and a logic circuit in photolithography technology, a reduction projection exposure apparatus for transferring a circuit pattern by a projection optical system projecting the circuit pattern onto a wafer, etc., has been conventionally used.

The critical dimension transferable by the projection exposure apparatus or the resolution is proportionate to a wavelength of light used for exposure, and inversely proportionate to the numerical aperture ("NA") of the projection optical system. The shorter the wavelength is, the better the resolution becomes. Therefore, the exposure light uses a shorter wavelength with the demand for the fine processing to semiconductor devices in recent years, and use of the wavelength of the ultraviolet light has shifted from an ultra-high pressure mercury lamp (i-line (a wavelength of about 365 nm)) to a KrF excimer laser (a wavelength of about 248 nm) and an ArF excimer laser (a wavelength of about 193 nm).

The semiconductor device becomes minute so rapidly that the lithography using the ultraviolet light has a limit. Then, a reduction projection exposure apparatus (hereafter, it is called, an "EUV exposure apparatus") using extreme ultraviolet light is developed to efficiently transfer a finer circuit pattern of 0.1 μm or less.

A chamber stores an exposure part of the exposure apparatus, and has a vacuum atmosphere to prevent attenuation of the exposure light, because the exposure light with such a short wavelength as the EUV light remarkably decreases at an ambient pressure.

Such a processing system arranges a load lock chamber to transfer a substrate as an object to be exposed between a chamber that houses in the exposure part and a substrate supplying part located under the ambient pressure (for instance, see Japanese Laid-Open Patent Application, Publication No. 10-092724). Here, the substrate as the object to be exposed is a mask (reticle) that has a circuit pattern and serves as an original edition, and means a transmitting type mask for transmitting the exposure light and a reflecting type mask for reflecting the exposure light.

FIGS. 18A and 18B are schematic block diagrams showing a configuration of a conventional processing system 1000. FIG. 18A is a sectional view, and FIG. 18B is a top view. The processing system 1000 has a high vacuum atmosphere in a processing chamber 1100 storing the exposure part. The processing chamber 1100 is connected with a reserving room 1110 storing a second transporter 1112.

A carrier mounting part 1310 as the substrate supply part is arranged in the ambient atmosphere, and a first transporter 1320 is arranged to access the carrier mounting part 1310 and the load lock chamber 1200. A clean booth 1300 is arranged to surround the first transporter 1320.

The load lock chamber 1200 includes a first gate valve 1220 for shielding between the load lock chamber 1200 and the carrier mounting part 1310 in the ambient atmosphere, and a second gate valve 1220 for shielding between the load lock chamber 1200 and the reserving room 1110.

A description will now be given of an operation of the processing system 1000. The first transporter 1320 takes out one mask from the carrier mounting on the carrier mounting part 1310, and transports the mask to the load lock chamber 1200. The first gate valve 1210 closes to shield the ambient atmosphere, and the load lock chamber 1200 exchanges the atmosphere after the mask is transported to the load lock chamber 1200 and is put on a mounting stage.

A description will now be given of a replacement of an atmosphere in the load lock chamber 1200. The vacuum-exhausting valve (not shown) opens when the clean booth 1300 and the processing chamber 1100 are shielded by closing the first gate valve 1210 and the second gate valve 1220, and then a vacuum pump (not shown) starts exhausting the gas of the load lock chamber 1200 through a vacuum-exhausting tube. The vacuum exhaustion is stopped by closing the vacuum-exhausting valve after the load lock chamber 1200 is exhausted to a predetermined degree of vacuum.

The second gate valve 1220 opens, and then the second transporter 1112 takes out the mask in the processing chamber 1100, and transports the mask to the exposure part stored in the processing chamber 1100 after the atmosphere replacement finishes in the load lock chamber 1200. The first transporter 1320 and the second transporter 1112 transport the mask for use with the exposure part to the carrier mounting part 1310 through the load lock chamber 1200 (for example, see Japanese Patent Application Publication Nos. 10-092724, 10-233423, 2000-123111, and 2001-085290).

However, when the mask is transported and the load lock chamber is replaced with the vacuum atmosphere, particles (contaminants) adhere to the mask disadvantageously. For instance, the particles swirl and adhere to the mask during the exhaust to replace the atmosphere of the load lock chamber. The particles adhered mask disadvantageously deteriorate the exposure, because a particle adhered part neither transmits nor reflects the exposure light (production of the exposure defect).

Thus, various methods are proposed to prevent the particles from adhering to the mask. For instance, it is proposed that a method arranges a pellicle to protect surfaces of particles with a transcript pattern, but this method may not apply because of a restriction of the material and the structure in the processing system using the EUV light, etc., with shorter wavelengths. It is difficult to use the material with the ultraviolet light or the visible radiation, because the material highly absorbs the light when the exposure light has a short wavelength. Thus, the material usable for a wavelength range of the EUV light does not exist.

Moreover, a method is proposed which arranges a detecting mechanism for detecting particles from adhering to the mask, in the processing chamber. However, this method decreases the throughput, because this processing chamber needs many components, a large size, and a long time to create a high vacuum atmosphere, since the detecting mechanism is arranged in the processing chamber maintained in a high vacuum atmosphere. Moreover, maintaining the high vacuum atmosphere becomes difficult. Although it is conceivable to arrange a detecting mechanism in the ambient environment (that is, a clean booth) for detecting the particles adhered to the mask, and to carry the mask into the processing chamber after the detecting mechanism detects the particles, this method cannot eliminate particles adhered during transportation.

On the other hand, another proposed method prevents swirls of the particles that adhere during a replacement to the vacuum atmosphere (that is, the exhaust is slowed down), and by exhausting slowly when the exhaust begins. However, the slow exhaust needs a long time from the ambient attainment to the high vacuum atmosphere, and the throughput decreases.

BRIEF SUMMARY OF THE INVENTION

Accordingly, it is an exemplary object of the present invention to provide a processing system that assures the throughput and executes high-quality processing by decreasing adhesions of particles to the object, and an exposure apparatus using the processing system.

A processing system of one aspect according to the present invention includes a supplying part for storing an object to be fed and for being maintained at an atmospheric pressure, a processing chamber for being maintained at a reduced pressure or vacuum atmosphere and for executing a predetermined processing to the object, the object being fed between the supplying part and the processing chamber, a vacuum chamber, arranged between the supplying part and the processing chamber, for storing the object at a pressure of 100 Pa or less, the vacuum chamber having a replaceable atmosphere, and a first load lock chamber, arranged between the supplying part and the vacuum chamber, for receiving and supplying the object between the supplying part and the vacuum chamber, the first load lock chamber having a replaceable atmosphere.

A processing system of another aspect according to the present invention includes a supplying part for storing an object to be fed and for being maintained at an atmospheric pressure, a processing chamber for being maintained at a reduced pressure or vacuum atmosphere and for executing a predetermined processing to the object, the object being fed between the supplying part and the processing chamber, a vacuum chamber, arranged between the supplying part and the processing chamber, for storing the object at a pressure of 100 Pa or less, the vacuum chamber having a replaceable atmosphere, and a remover which removes particles that adhere to the object, and is arranged in the vacuum chamber.

A processing system of another aspect according to the present invention includes a supplying part for storing an object to be fed and for being maintained at an atmospheric pressure, a processing chamber for being maintained at a reduced pressure or vacuum atmosphere and for executing a predetermined processing to the object, the object being fed between the supplying part and the processing chamber, a load lock chamber, arranged between the supplying part and the processing chamber, and for receiving and supplying the object between the supplying part and the processing chamber, the load lock chamber having a replaceable atmosphere, and a remover which removes particles that adhere to the object, and is arranged in the load lock chamber.

A transporting method, of another aspect according to the present invention, for transporting an object to be fed from a supplying part for storing the object and for being maintained at an atmospheric pressure to a processing chamber for being maintained at a reduced pressure or vacuum atmosphere and for executing a predetermined processing to the object, includes the steps of holding the object in a space maintained at a pressure of 100 Pa or less, and removing particles that adhere to the object held in the space maintained at a pressure of 100 Pa or less by the holding step.

An exposure apparatus of another aspect according to the present invention includes a processing system comprising a supplying part for storing an object to be fed and for being maintained at an atmospheric pressure, a processing chamber for being maintained at a reduced pressure or vacuum atmosphere and for executing a predetermined processing to the object, the object being fed between the supplying part and the processing chamber, a vacuum chamber, arranged between the supplying part and the processing chamber, for storing the object by a pressure of 100 Pa or less, the vacuum chamber having a replaceable atmosphere, and a first load lock chamber, arranged between the supplying part and the vacuum chamber, for receiving and supplying the object between the supplying part and the vacuum chamber, the first load lock chamber having a replaceable atmosphere, wherein the exposure apparatus exposes a predetermined pattern formed on the object onto a wafer.

An exposure apparatus of another aspect according to the present invention includes a processing system comprising a supplying part for storing an object to be fed and for being maintained at an atmospheric pressure, a processing chamber for being maintained at a reduced pressure or a vacuum atmosphere and for executing a predetermined processing to the object, the object being fed between the supplying part and the processing chamber, a vacuum chamber, arranged between the supplying part and the processing chamber, for storing the object by a pressure of 100 Pa or less, the vacuum chamber having a replaceable atmosphere, and a first load lock chamber, arranged between the supplying part and the vacuum chamber, for receiving and supplying the object between the supplying part and the vacuum chamber, the first load lock chamber having a replaceable atmosphere, wherein the exposure apparatus exposes a predetermined pattern onto the object.

An exposure method of another aspect according to the present invention includes the steps of transporting a mask that a predetermined pattern is formed on by using a transporting method, and exposing the predetermined pattern onto the object by using the mask transported by the transporting step, wherein the transporting method for transporting the object from a supplying part for storing the object and for being maintained at an atmospheric pressure to a processing chamber for being maintained at a reduced pressure or vacuum atmosphere and for executing predetermined processing to the object, the transporting method comprising the steps of holding the object in a space maintained at a pressure of 100 Pa or less, and removing particles that adhere to the object held in the space maintained at a pressure of 100 Pa or less by the holding step.

An exposure method of another aspect according to the present invention includes the steps of transporting a wafer that a predetermined pattern is formed on by using a transporting method, and exposing the predetermined pattern onto the wafer transported by the transporting step, wherein the transporting method for transporting the object from a supplying part for storing the object and for being maintained at an atmospheric pressure to a processing chamber for being maintained at a reduced pressure or vacuum atmosphere and for executing a predetermined processing to the object, the transporting method comprising the steps of holding the object in a space maintained at a pressure of 100 Pa or less, and removing particles that adhere to the object held in the space maintained at a pressure of 100 Pa or less by the holding step.

A device fabricating method of another aspect according to the present invention includes the steps of exposing an object to be fed by an exposure apparatus, and developing the exposed object to be fed, wherein the exposure apparatus comprises a processing system comprising a supplying part for storing the object and for being maintained at an atmospheric pressure, a processing chamber for being maintained at a reduced pressure or vacuum atmosphere and for executing a predetermined processing to the object, the processing system and for transporting the object between the supplying part and the processing chamber, a vacuum chamber, arranged between the supplying part and the processing chamber, for storing the object by a pressure of 100 Pa or less, the vacuum chamber having a replaceable atmosphere, and a first load lock chamber, arranged between the supplying part and the vacuum chamber, for receiving and supplying the object between the supplying part and the vacuum chamber, the first load lock chamber having a replaceable atmosphere, wherein the exposure apparatus exposes a predetermined pattern formed on the object onto a wafer.

A device fabricating method of another aspect according to the present invention includes the steps of exposing an object to be fed by an exposure apparatus, and developing the exposed object to be fed, wherein the exposure apparatus comprises a processing system comprising a supplying part for storing the object and for being maintained at an atmospheric pressure, a processing chamber for being maintained at a reduced pressure or vacuum atmosphere and for executing a predetermined processing to the object, the object being fed between the supplying part and the processing chamber, a vacuum chamber, arranged between the supplying part and the processing chamber, for storing the object by a pressure of 100 Pa or less, the vacuum chamber having a replaceable atmosphere, and a first load lock chamber, arranged between the supplying part and the vacuum chamber, for receiving and supplying the object between the supplying part and the vacuum chamber, the first load lock chamber having a replaceable atmosphere, wherein the exposure apparatus exposes a predetermined pattern onto the object.

DETAILED DESCRIPTION OF THE PREFERRED EMBODIMENTS

Figure 1A:
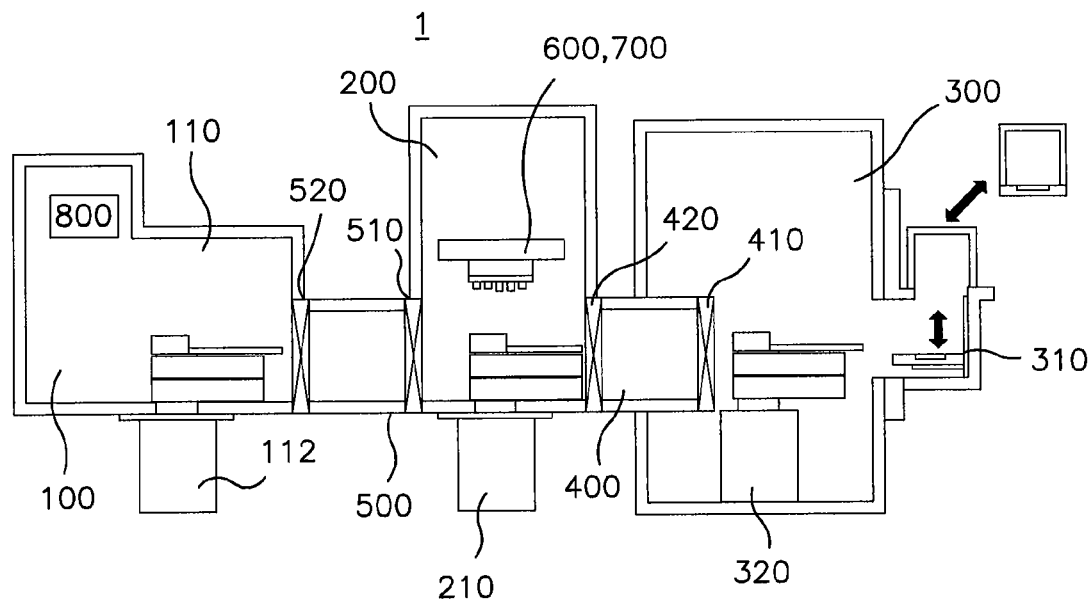
FIGS. 1A and 1B are schematic block diagrams showing a configuration of a processing system of one embodiment according to the present invention.
Figure 1B:
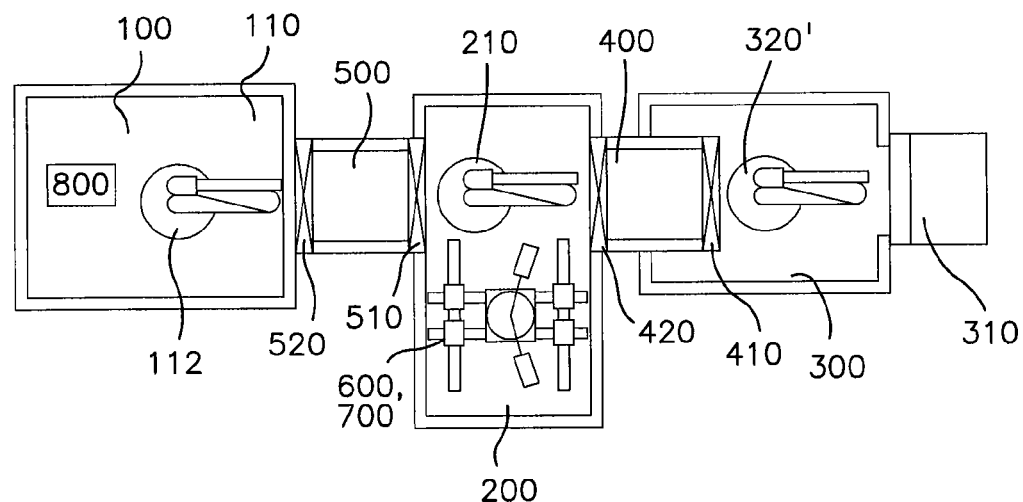

With reference to the accompanying drawings, a description will now be given of a processing system of one embodiment according to the present invention. Here, FIGS. 1A and 1B are schematic block diagrams showing a configuration of a processing system 1 as one embodiment according to the present invention, FIG. 1A is a sectional view, and FIG. 1B is a top view.

The present invention does not limit a process of the processing system to exposure, though the processing system 1, in the following embodiment, transports a mask (or wafer) as an object to be fed, and executes exposure of the transported mask (or wafer). However, the present invention is suitable for exposure because the exposure demands a high throughput and a mask (or wafer) with little particle adhesions, as described above. This embodiment discusses an example of the transportation of the mask as the object.

The processing system 1 includes, as shown in FIG. 1, an exposure apparatus 800, which will be described later with reference to FIG. 14 as an exposure processing part for executing an exposing process using a mask, a processing chamber 100 maintained in a high vacuum atmosphere, a vacuum chamber 200 maintained in an arbitrary low vacuum atmosphere between 0.1 and 100 Pa, and a carrier mounting part 310, as a mask supplying part, maintained at an ambient pressure (atmospheric pressure), for storing one or plural mask(s). In this embodiment, the carrier mounting part 310 is a SMIF system. Here, the ambient pressure (or the atmospheric pressure) does not have to be one atmospheric pressure, and, preferably, be a pressure difference from a reduced pressure in the processing chamber (preferably, a pressure that is higher than the reduced pressure, more preferably, a pressure that is the same as the pressure in the clean room in which the exposure apparatus is installed). The processing chamber 100 is connected to a chamber reserving room 110 that stores a third transporter 112, which will be described later.

Though atmospheric gas of the vacuum chamber 200 is not especially limited, this embodiment uses usual air to simplify the air supply and to exhaust air. Another gas atmosphere, such as $N_2$ and He, may be used if the existence of humidity and $O_2$ are problematic when air is used for the atmosphere gas. However, when the other gas atmosphere, such as $N_2$ and He, is used, it is necessary to note an operation for a replacement of the atmosphere in the first load lock chamber 400, which will be described later.

The first load lock chamber 400 is arranged between the vacuum chamber 200 and the carrier mounting part 310, and a second load lock chamber 500 is arranged between the chamber reserving room 110 and the vacuum chamber 200 to receive and to pass the mask between the different atmospheric areas. Each of the carrier mounting part 310 of the ambient side, the vacuum chamber 200, and the chamber reserving room are connected through a first gate valve 410, a second gate valve 420, a third gate valve 510, and a fourth gate valve 520.

The first transporter 320 for transporting the mask between the carrier mounting part 310 and the first load lock chamber 400 is arranged in the ambient atmosphere, and the clean booth 300 is arranged to surround the first transporter 320. In other words, the clean both 300 involves the whole mask transportation parts with the ambient atmosphere. The first load lock chamber 400 has an opening part of an ambient side in the clean booth 300, and the carrier mounting part 310 arranges an opening of a SMIF system on a wall of the clean booth 300.

The vacuum chamber 200 includes a second transporter 210, arranged so as to be accessible to the first load lock chamber 400, the second load lock chamber 500, a remover 700, and a detecting means 600 that is stored in the vacuum chamber 200 and will be described later, for transporting the mask between the first load lock chamber 400 and the second load lock chamber 500.

The chamber reserving room 110 includes a third transporter 112 for transporting the mask between the second load lock chamber 500 and the exposure apparatus in the processing chamber 100.

Figure 2:
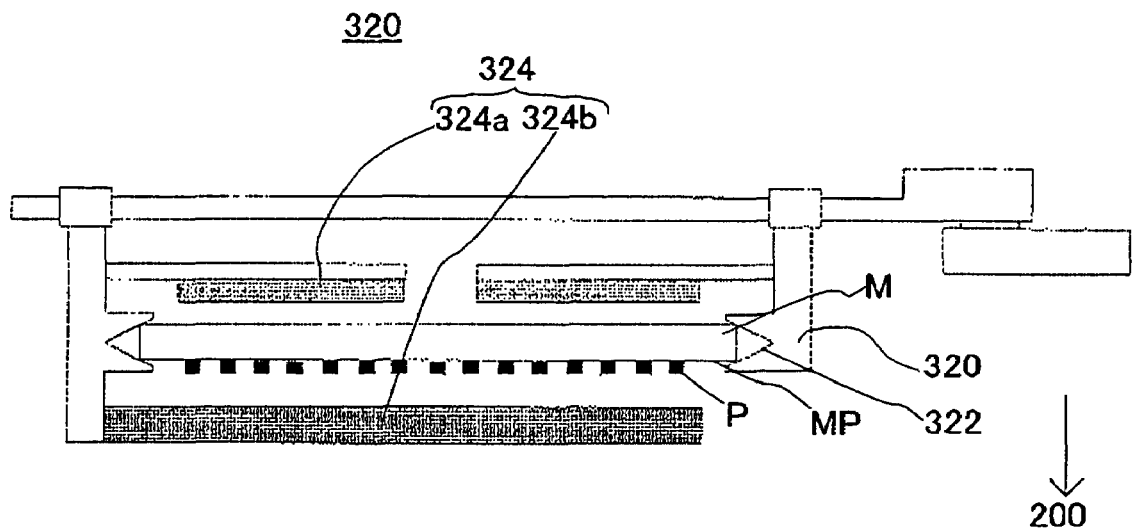
FIG. 2 is a schematic sectional view showing that a first transporter shown in FIG. 1 holds a mask.

A description will now be given of a mask handling of the second transporter 320, the second transporter 210 and the third transporter 112. FIG. 2 is a schematic sectional view showing that the first transporter 320, shown in FIG. 1, holds a mask M. The first transporter 320 holds by a mechanical clamp and transports the mask M, as shown in FIG. 2. Concretely, the first transporter 320 includes a holding hand 320, which holds the mask M so that the pattern surface MP of a transcribed pattern may face the gravity direction. The holding hand 320 includes a holding detent 322 that opens and closes, and holds the edge part of the mask M with at least two detents. The second transporter 210 and the third transport 112 have a configuration similar to that of the first transporter 320, and hold and transport the mask M.

The first transporter 320 and the second transporter 210 include a shield 324 for preventing the adhesions of particles to the mask M during transportation. The shield 324 prevents adhesions of particles to mask M by using, for example, a principle of a heat migrating force. The shield 324 includes a heating part 324a for heating the mask M and the neighborhood, and a cooling part 324b, which is arranged near the mask M, for maintaining a lower temperature than that of the mask M.

The particles that approach the mask M, and float in the space for transporting the mask M receive the force (the heat migrating force) toward the cooling part 324b from the mask M by the principle of the heat migrating force. Therefore, it is possible to prevent the particle adhesions onto the mask M because the particles approach the cooling part 324b apart from the mask M.

The third transporter 320 does not need the shield 324, because it is arranged in the high vacuum atmosphere. This is because the prevention of the article adhesions to the mask M by the heat migrating force does not effectively work without a high pressure, not many particles exist in the high vacuum atmosphere, and the particles fall perpendicularly by their own weight.

The vacuum chamber 200 houses the detecting means 600 for detecting the particles that have adhered to the mask, and the remover 700 for removing the particles from the mask.

Figure 3:
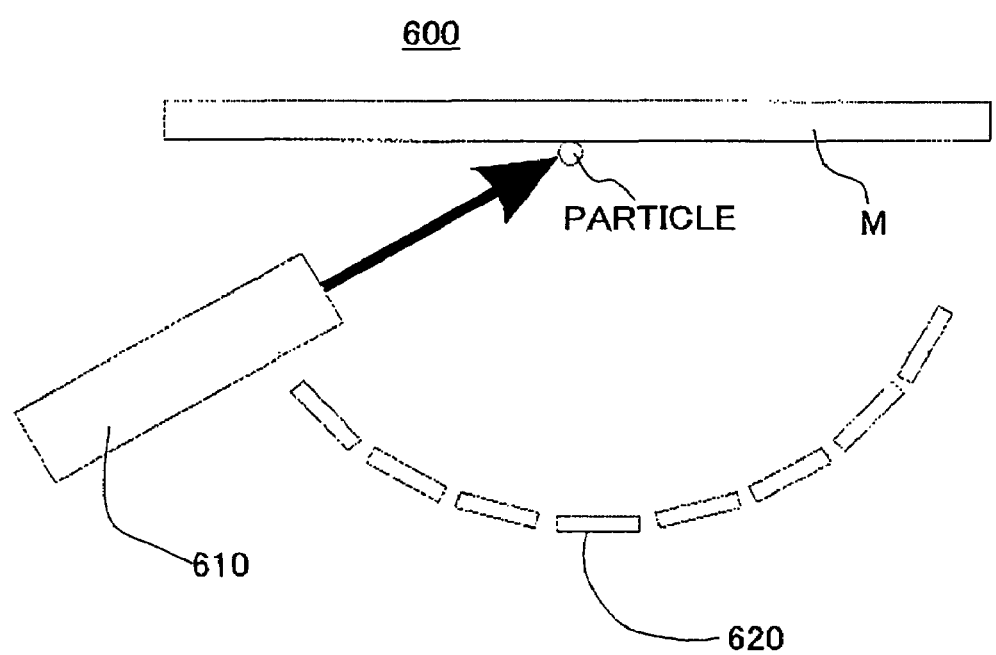
FIG. 3 is a schematic sectional view showing one exemplary structure of a detecting means shown in FIG. 1.
Figure 4:
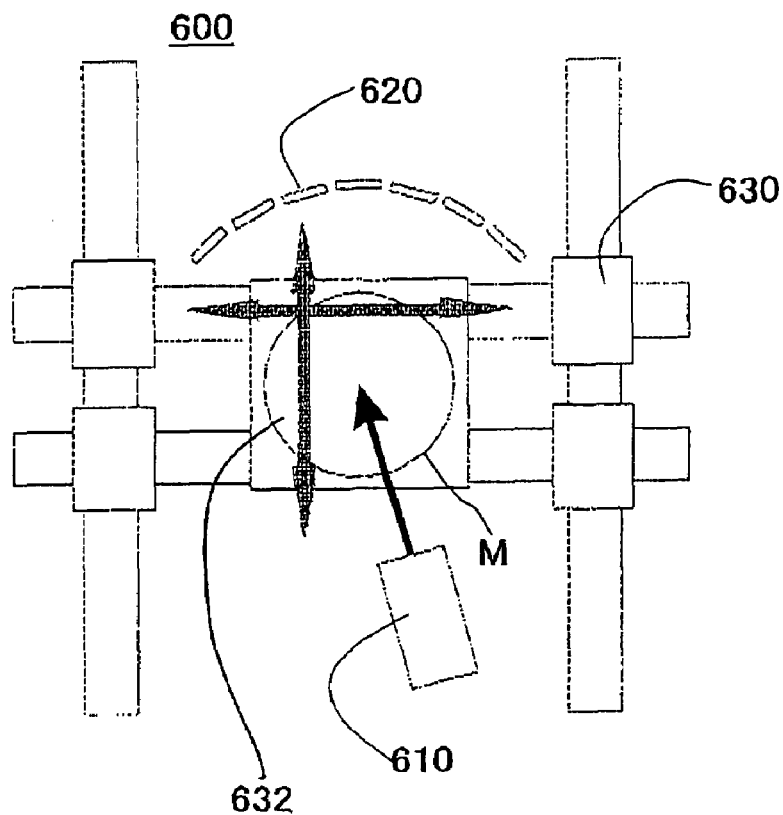
FIG. 4 is a schematic top view showing a configuration as one embodiment of a detecting means shown in FIG. 1.

FIGS. 3 and 4 show one embodiment of the detecting means 600. FIG. 3 is a schematic sectional view showing one exemplary structure of the detecting means 600, shown in FIGS. 1A and 1B. FIG. 4 is a schematic top view showing a configuration as one embodiment of the detecting means 600, shown in FIG. 1. The detecting means 600 irradiates a laser beam from a light source 610 to the mask M, receives the laser beam reflected by the particles through a detector 620, and detects the sizes and the positions of the particles.

The detecting means 600 detects the particles on the entire surface of the mask M by scanning the mask with a laser beam. The mask M is held through a chuck 632 on a stage 630 that can scan the mask M along two horizontal axes, as shown in FIG. 4.

Figure 5:
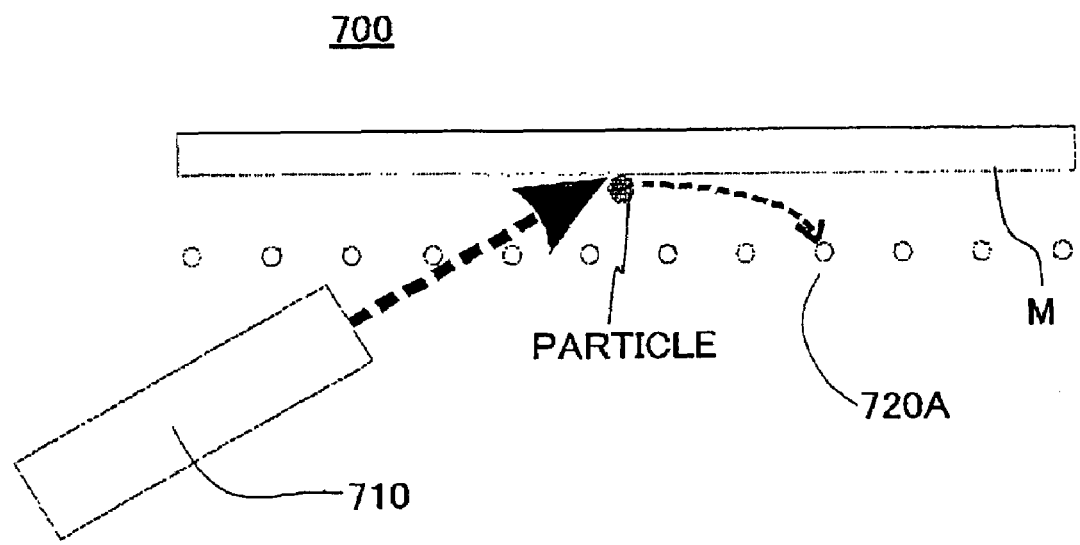
FIG. 5 is a schematic sectional view showing a configuration as one embodiment of a remover shown in FIG. 1.

FIG. 5 shows one example of the remover 700. FIG. 5 is a schematic sectional view showing an exemplary configuration of the remover 700, shown in FIGS. 1A and 1B. The remover 700 is configured to irradiate a pulsed laser beam from an irradiating part 710 to a predetermined position on the mask M. The pulsed laser beam irradiated to the adhering position on the mask M, which adheres the particles as detected by the detecting means 600, gives energy to the mask M, and generates a surface acoustic wave. This surface acoustic wave gives kinetic energy to the particles and removes the particles from the mask.

In the vacuum chamber 200, a larger amount of particles falls by gravitation than an amount of particles that goes up in an anti-gravity direction (or an upward direction), due to collision between the particles and the gas molecules. In other words, the particles fall basically by gravitation. However, some particles are removed from the mask and then return to, and adhere to the mask again. Accordingly, the remover 700 in this embodiment includes an adsorbing part 720 for adsorbing the removed particles.

The adsorbing part 720 is implemented by a metal part 720A, such as a wire net, shown in FIG. 5. The metal part 720A should be arranged opposite to the mask M at a suitable interval because an abrasive electrification charges the particles. However, it is not constant whether the particles are positively or negatively charged. Accordingly, the metal part 720A is configured to alternately switch its charge between plus and minus, and this switch is arbitrarily selected from a speed as slow as every few seconds to a speed as fast as several tens of Hz.

Since the particles removed (or separated) from the mask M approach the metal part 720A by the charges and gravity and are caught by the metal part 720A, they do not again adhere to the mask M. The pulsed laser beam for removing the particles is irradiated onto the mask M through the metal part 720A (through divisions of the wire net if the metal part 720A is the above wire net).

A description will now be given of an operation of the processing system 1, i.e., a transportation of the mask. First, the first transporter 320 goes into the carrier mounting part 310 in the ambient atmosphere, and takes out the mask. The first transporter 320 that holds the mask shortens the arm, and confirms the state of the first load lock chamber 400. The first transporter 320 transports the mask to the first load lock chamber 400 when the first load lock chamber 400 can receive the mask, i.e., when its inside becomes an ambient atmosphere condition and the first gate valve 410 opens. When the mask is stored in the first load lock chamber 400, the first gate valve 410 closes for a replacement of the atmosphere.

When the first gate valve 410 closes, a vacuum-exhausting valve (not shown) opens, and then, a vacuum pump (not shown) starts exhausting the gas in the first load lock chamber 400. The vacuum-exhausting valve closes and the exhaust ends, when the first load lock chamber 400 is exhausted to a predetermined pressure. The pressure detecting means (not shown) confirms the pressure in the first load lock chamber 400, and if the pressure is within a predetermined pressure range, the replacement of the atmosphere in the first load lock chamber 400 completes.

The second gate valve 420 opens and then the second transporter 210 goes into the first load lock chamber 400, taking out the mask from the first load lock chamber 400 when the replacement of the atmosphere is completed in the first load lock chamber 400. The second transporter 210 finishes the transportation to the vacuum chamber 200 by supplying the mask to a mask chuck (not shown) in the vacuum chamber 200.

A description will now be given of the replacement of the atmosphere that uses $N_2$ and He, etc., for the atmospheric gas of the first load lock chamber 400. When the first gate valve 410 closes, the vacuum-exhausting valve (not shown) opens, and then, the vacuum pump (not shown) starts exhausting the gas in the first load lock chamber 400. The vacuum-exhausting valve closes and the exhaust ends, when the first load lock chamber 400 is exhausted to a predetermined pressure. Here, the predetermined vacuum level is determined to be based on capacities of the first load lock chamber 400 and the vacuum chamber 200, the frequency of the transportation, and the purity of the atmospheric gas in the vacuum chamber 200, and is set to be much lower than the usual pressure in the vacuum chamber 200. When the exhaust ends, the gas supplying valve (not shown) opens, and then, the gas supplying means (not shown) supplies the predetermined atmospheric gas. When the pressure of the supplied atmospheric gas reaches the predetermined pressure, the gas supplying valve closes. The pressure detecting means (not shown) confirms the pressure in the first load lock chamber 400, and, if the pressure is within a predetermined pressure range, the replacement of the atmosphere completes in the first load lock chamber 400. The transportation of the mask after the atmosphere replaced in the first load lock chamber 400 is as mentioned above.

Next, the detecting means 600 detects adhesions of particles to the mask carried into the vacuum chamber 200. First, the chuck 632 on the movable stage 630 holds the mask, and the stage 630 moves to a predetermined position, at which the laser beam from the light source 610 in the detecting means 600 is irradiated to the edge of the mask.

The stage 630 moves along two-axis directions from the predetermined position on a horizontal plane, while the laser beam is irradiated onto the mask. If the particles do not exist on the mask, the reflected light from the mask is reflected to the opposite direction at an angle equal to the incident angle. If the particles exist on the mask, the reflected light is reflected to various directions depending upon the shapes of the particles.

Therefore, the detector 620 monitors the reflected light of the laser beam, and detects the existences and shapes of the particles according to the state of this reflected light. It is possible to identify locations at which the particles exist on the mask based on the location information of the stage 630.

The removal of particles follows when the detections of the particles end on the entire surface of the mask.

First, the stage 630 moves so that the laser beam from the irradiating part 710 in the remover 700 is irradiated to the position, at which the detecting means 600 detects the particle. When the laser beam is irradiated onto the mask, the incidence of the laser beam gives energy to the mask, and then, a surface acoustic wave is generated on the surface. This surface acoustic wave gives kinetic energy to the particles, and removes the particles from the mask. The removed particles are charged by an abrasive electrification, being removed by the metal part 720A, such as a wire net, which is arranged near the mask, and can switch its charges between plus and minus at several Hz to several tens of Hz.

When plural particles exist, the stage 630 moves so that the laser beam from the irradiating part 710 is irradiated to the position at which a next particle exists. The laser beam from the irradiating part 710 is irradiated onto the mask, removing the particles after the stage 630 moves. The removal of the particles repeats until all particles are removed from the mask. When the particles are removed, the vacuum chamber 200 is maintained at the pressure of 100 Pa or less. In other words, the particles are removed under a pressure of 100 Pa or less.

The second transporter 210 transports the mask, for which the particles are detected and from which the particle is removed, into the second load lock chamber 500. When the second transporter 210 takes out the mask from the chuck 632 of the stage 630, the state of the first load lock chamber 400 is confirmed.

The second transporter 210 transports the mask to the second load lock chamber 500 when the second load lock chamber 500 can receive the mask, i.e., a pressure difference between the second load lock chamber 500 and the vacuum chamber 200 is within a predetermined pressure range, and the third gate valve 510 opens. When the mask is stored in the second load lock chamber 500, the third gate valve 510 closes.

A vacuum-exhausting valve (not shown) opens, and a vacuum pump (not shown) starts exhausting the gas from the second load lock chamber 500 when the third gate valve 510 closes. Here, the vacuum pump used for the first load lock chamber 400 cannot be used because the desired pressure in the second load lock chamber 500 is a high vacuum atmosphere (for instance, $1 \times 10^{-8}$ Pa). Therefore, the second load lock chamber 500 uses another vacuum pump. Concretely, though a turbo-molecular pump could be generally used, this embodiment does not limit or specify a type of a vacuum pump. The vacuum-exhausting valve closes and the exhaust ends, when the second load lock chamber 500 is exhausted to a predetermined pressure. The pressure detecting means (not shown) confirms pressure of the second load lock chamber 500, and, if the pressure is within a range of predetermined pressure, the replacement of the atmosphere completes in the second load lock chamber 500. When the replacement of the atmosphere completes in the second load lock chamber 500, the fourth gate valve 520 opens, and the third transporter 112 goes into the second load lock chamber 500, taking out the mask from the second load lock chamber 500. The third transporter 112 transports the mask taken out from the second load lock chamber 500 into an exposure apparatus 800 as an exposure processing part stored in the processing chamber 100, and the exposure apparatus 800 exposes the mask.

This embodiment transports the mask to the second load lock chamber 500 after detecting and removing the particles in the vacuum chamber 200, but the present invention is not limited to this embodiment. It is possible to again determine whether the particles exist after the particles are removed, and to transport the mask from the second load lock chamber 500 to the processing chamber 100 after determining that the particles do not exist on the mask.

The processing system 1 can provide high-quality exposure by detecting and removing the particles in the vacuum chamber 200 and by preventing the particles that have adhered to the mask even if the particles adhere to the mask while transporting the mask from the carrier mounting part 310 (at the atmosphere pressure) to the vacuum chamber 200. The particles do not easily swirl in the exhaust, etc., and the particles are prevented from adhering onto the mask, because an atmosphere is a high vacuum when the mask is transported to the processing chamber 100 from the vacuum chamber 200. The processing chamber 100 can be maintained to be small, because the vacuum chamber 200 houses the detecting means 600 and the remover 700. As a result, a long time is not required to exhaust the processing chamber 100, and good throughput is assured.

Figure 6:
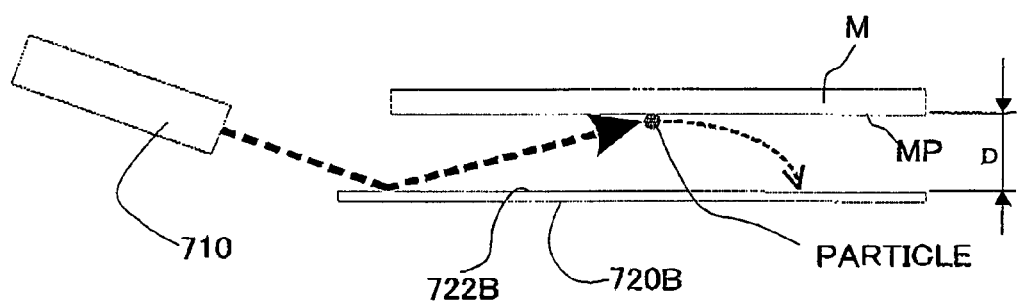
FIG. 6 is a schematic top view showing a configuration as one embodiment of a remover shown in FIG. 1.

The remover 700 may use, as shown in FIG. 6, a charged mirror 720B as the adsorbing part 720 for collecting the particles that separate from the mask M and for preventing their re-adhesions onto the mask. Here, FIG. 6 is a schematic top view showing one exemplary configuration of one example of the remover 700, shown in FIGS. 1A and 1B.

With reference to FIG. 6, the remover 700 includes a mirror 720B arranged near the mask M, or parallel to a pattern surface MP of the mask M and apart from the mask by a distance D. The mirror 720B is arranged so that a reflection surface 722B faces the mask M. The irradiating part 710 is arranged between the mask M and the mirror 720B, so that the laser beam reflects on the reflection surface 722B on the mirror 720B and is irradiated to the pattern surface M in the mask M. The mirror 720B is configured to alternately switch its charge between plus and minus.

The stage 630 moves for the removal of particles, so that the laser beam from the irradiating part 710 in the remover 700 is irradiated to the position, at which the detecting means 600 detects the particle. When the laser beam reflects to the reflection surface 722B in the mirror 720B and is irradiated onto the mask M, the incidence of the laser beam gives energy to the mask M, and then, a surface acoustic wave is generated on the surface. This surface acoustic wave gives kinetic energy to the particles, and removes the particles from the mask M. The removed particles are charged by an abrasive electrification, removed by the mirror 720B, which is arranged parallel near the mask, and can switch its charges between plus and minus at several Hz to several tens of Hz.

Figure 7:
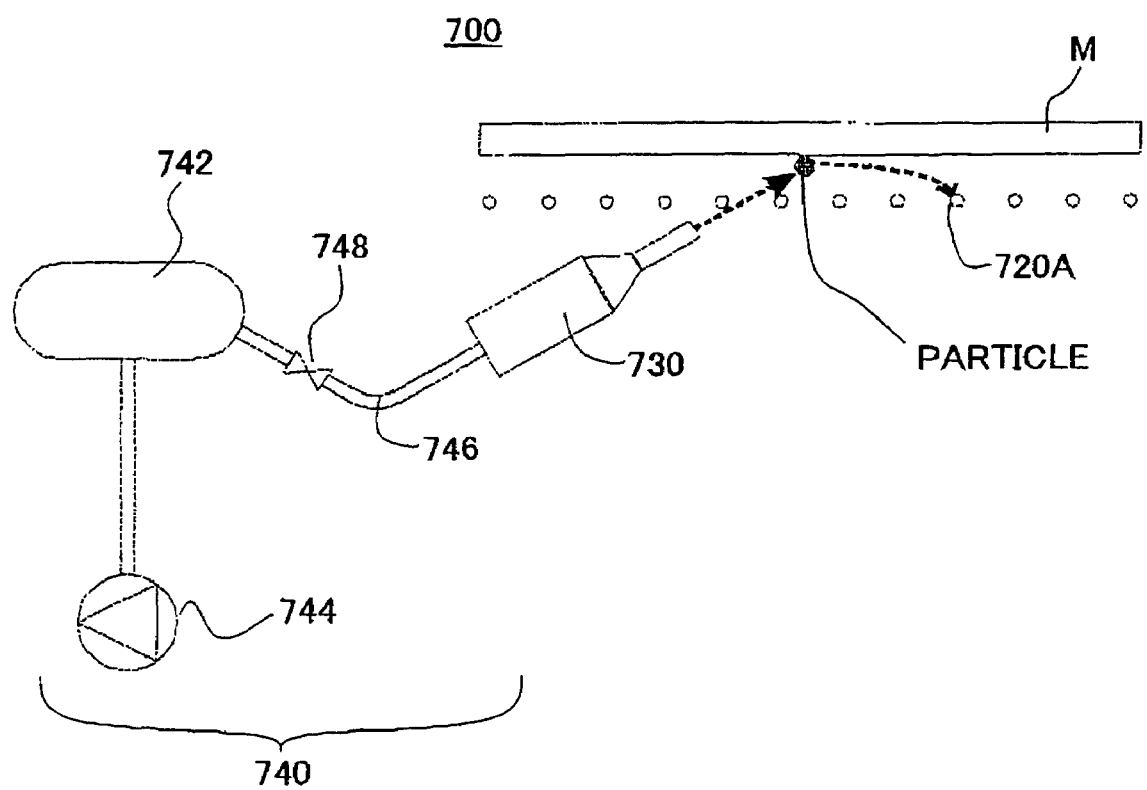
FIG. 7 is a schematic sectional view showing a configuration as one embodiment of a detecting means shown in FIG. 1.

The remover 700 may remove the particles by spraying pulsed air onto the mask M, as shown in FIG. 7. Here, FIG. 7 is a schematic sectional view showing an exemplary configuration of the detecting means 700, shown in FIG. 1.

With reference to FIG. 7, the remover 700 includes a small aperture nozzle 730, a compressed gas supplying part 740 for supplying compressed gas to the nozzle 730 and for gushing the gas from the nozzle 730, and a gas exhausting port (not shown) for collecting the gushed gas. It is desirable that the gas supplied to the nozzle 730 by the compressed gas supplying part 740 is the same as the atmospheric gas in the vacuum chamber 200. Suppose that, the atmospheric gas in the vacuum chamber 200 is the ambient air of 100 Pa.

The compressed gas supplying part 740 includes a tank 742 for temporarily storing the high pressure gas, a compressing part 744 for filling the high pressure gas in the tank 742, a piping 746 for supplying the high pressure gas to the nozzle 730, and a valve 748, which is arranged on the piping 746, for controlling the supply and the half of the gas. The compressing part 744 captures the ambient air through a ULPA filter (not shown), and compresses and supplies it to the tank 742. A pressure in the tank 742 is higher than the compressed ambient air by 500 KPa-700 KPa.

The stage 630 moves so that the gas with a high pressure from the nozzle 730 in the remover 700 gushes to the position at which detecting means 600 detects the particles when the particles are removed. When the valve 748 opens, the tank 742 supplies high pressure gas (air) to the nozzle 730 through the piping 746, and then, the high pressure gas gushes from the nozzle 730. The air gushed from the nozzle 730 forms a gas flow in the surroundings of the particles while diffusing. At this time, a force is added to the particles by hitting the gas, and the particles seceded from mask M and are removed. A large particle receives a stronger force and is easily removed because a flow velocity of the gas is strong near the mask M. The removed particles are charged by the abratio electrification, being removed by the metal part 720A, such as a wire net, which is arranged near the mask, and can switch its charges between plus and minus at several Hz to several tens of Hz.

When plural particles exist on the mask M, the stage 630 moves so that a high pressure gas from the nozzle 730 gushes to the position at which a next particle exists. The high pressure gas gushes from the nozzle 730, removing the particles after the stage 630 moves. The removal of the particles repeats until all particles are removed from the mask M.

Figure 8:
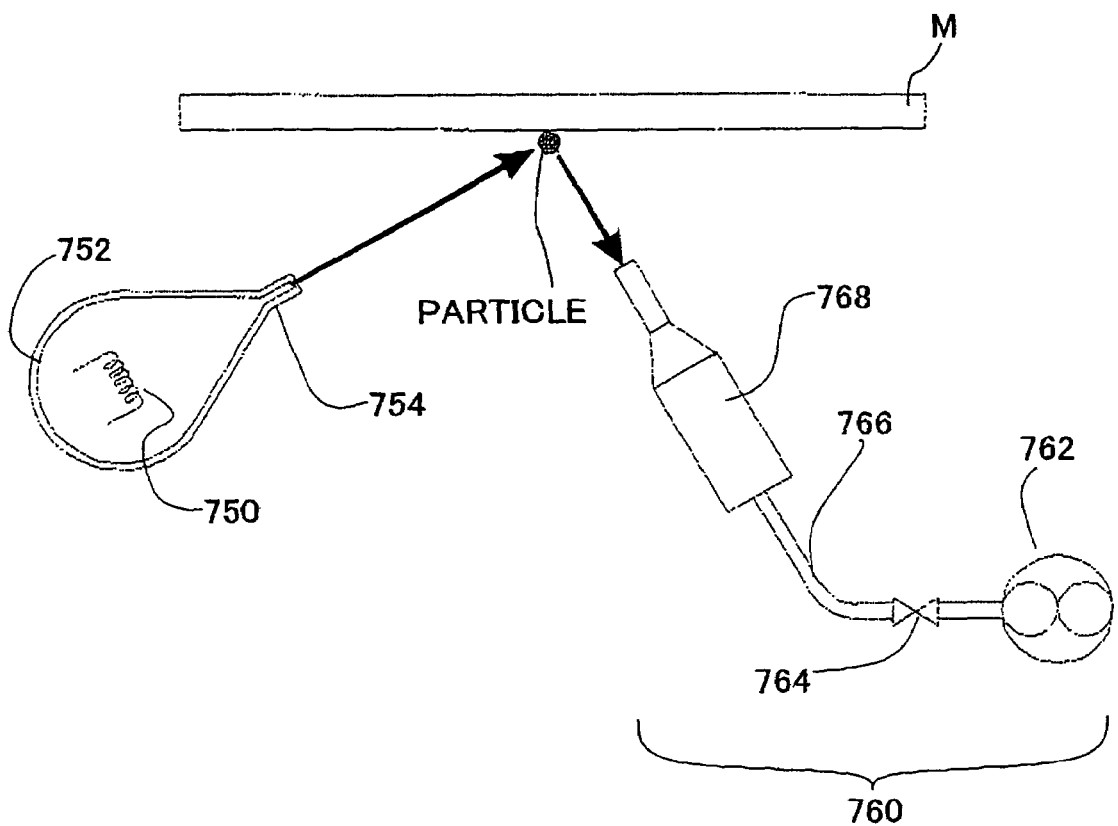
FIG. 8 is a schematic sectional view showing a configuration as one embodiment of a detecting means shown in FIG. 1.

The remover 700 may remove the particles by burning the particles using infrared radiation, as shown in FIG. 8. Here, FIG. 8 is a schematic sectional view showing an exemplary configuration of the detecting means 700, shown in FIG. 1. Using microwaves can achieve a similar effect, though the particles are burnt by using the infrared radiation in this embodiment.

With reference to FIG. 8, the remover 700 includes a generating part 750 for generating infrared radiation, a condenser 752 for condensing the generated infrared radiation, an irradiating part 754 for irradiating the condensed infrared radiation, and a residue remover 760 for removing a residue of the part that is burned by irradiating the infrared radiation.

Though having various configurations, the residue remover 760 in this embodiment has a configuration for removing the residue by a vacuum. The residue remover 760 includes a vacuum pump 762, a piping 766 with a valve 764, and a vacuum nozzle 768. The vacuum pump 762 always drives and opens the valve 764 when the residue is removed, and sucks gas from the nozzle 768, removing the residue of the burned particles by the gas flow.

In the removal of the particles, when the stage 630 moves so that infrared radiation from the irradiating part 754 of the remover 700 is irradiated to the position, at which the detecting means 600 detects the particle, the generating part 750 operates to generate the infrared radiation. The generated infrared radiation reflects and condenses by the condenser 752, and is irradiated to the particles on the mask M. Temperature of the particles rises by receiving energy from the infrared radiation, and the particle burns.

A kind of the particles includes not only particles that sublime without leaving the residue by combustion, but also, other particles, such as an organism that remains as residue on the mask. The nozzle 768 in the residue remover 760 moves to the position at which the residue remains when the residue remains or the residue might remain. The position at which the residue remains is the same position as the position at which the particles exist since the combustion of the particles generates the residue as mentioned above. When the valve 764 opens, the nozzle 768 sucks the gas, and then, the gas flow sucks and removes the residues of the particles.

When plural particles exist on the mask, the stage 630 moves so that infrared radiation from the irradiating part 754 is irradiated to the position at which a next particle exists. The infrared radiation form the irradiating part 754 is irradiated to the particles on the mask M, removing the particles after the stage 630 moves. The removal of the particles repeats until all particles are removed from the mask M.

Figure 9:
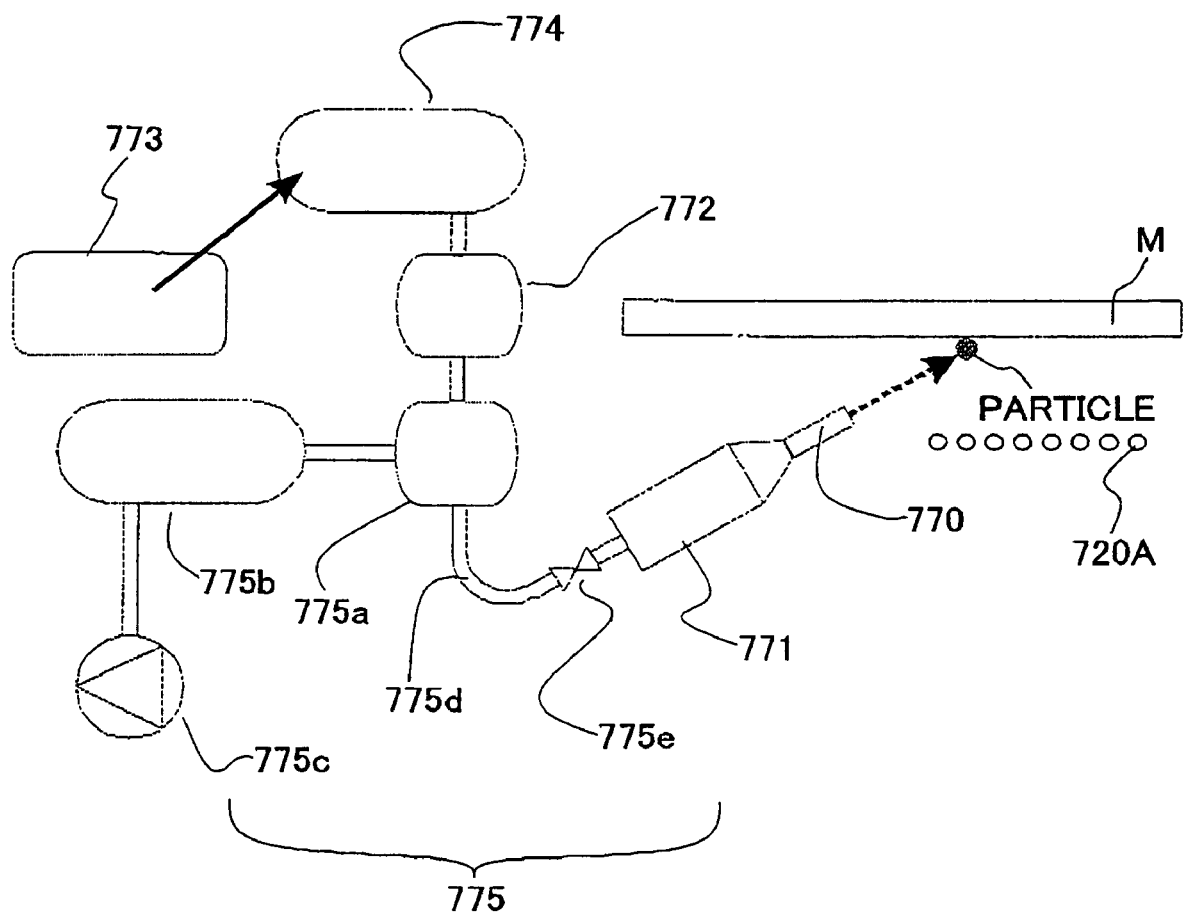
FIG. 9 is a schematic sectional view showing a configuration as one embodiment of a detecting means shown in FIG. 1.

The remover 700 may remove the particles by spraying predetermined particles on the mask M, as shown in FIG. 9. Here, FIG. 9 is a schematic sectional view showing an exemplary configuration of the detecting means 700 shown in FIG. 1.

With reference to FIG. 9, the remover 700 includes a nozzle 770 with a small sum diameter, a grain supplying part 771 for supplying predetermined grains to the nozzle 770 and for gushing the predetermined grains form the nozzle 770, and a grain refinement part 772 for generating the predetermined grains.

The predetermined grains are desirable to be evaporated in the vacuum, for example, a solid material formed by cooling the gas, and microscopic grains formed like minute grains. In this embodiment, dry ice that coagulates carbon dioxide ($CO_2$) gas to minute grains is used.

An object to be generated by an external generating part 773 is generally stored in a tank 774, and is used as dry ice with minute grains. However, the dry ice frequently has a case that each grain clings mutually and the diameter changes by taking surrounding carbon and a sublime. In this case, the dry ice with minute grains stored in the tank 774 is again generated by the grain refinement part 272 to refine the dry ice with a constant size after being generated by the external generating part 773, because it is not likely to be able to gush from the nozzle 770 smoothly.

The grain size of the dry ice is determined based on a consideration that a change of a grain diameter by subliming when the grains reach the particles as a removal target, after gushing from the nozzle 770, under an environment that the particles removed in a low or a high vacuum atmosphere. For instance, the grain size of the dry ice should be set to be about 0.12 μm when the grain size of the dry ice is set to be 0.1 μm for removing the particles with a grain size of 0.1 μm, and decreases to 20% by the sublime until reaching the particles.

The dry ice grains that are straightened by the grain refinement part 772 about particle size and shape is mixed with high pressure gas in an intermingling tank 775a, and receives a gushed force. The gas that is mixed with the dry ice grains in the intermingling tank 775a and is supplied to the nozzle 770 is desirable to be the same as atmospheric gas or the same as dry ice. This gas, in this embodiment, is air with 100 Pa, the same as in the vacuum chamber 200.

A mixing part 775, for mixing dry ice grains with gas, includes a tank 775b for storing the high pressure gas, a compressing part 775c for filling the high pressure gas into the tank 775b, a mixing tank 775a for mixing the dry ice grains with the high pressure gas and for storing it, a piping 775d for supplying the dry ice grains mixed with the high pressure gas to the nozzle 770, and a valve 775e, which is arranged on the piping 775d, for shielding to supply and to stop the dry ice grains.

The compressing part 775c supplies air into the tank 775b by taking air through the ULPA filter (not shown) and compressing it. The pressure in the tank 775a is higher than compressed air by 500 KPa-700 KPa. The dry ice grains mixed with the high pressure gas by the mixing tank 775a is supplied to the grain supplying part 771 through the piping 775d, and gushes from the nozzle 770 with the gush of high pressure gas.

The stage 630 moves for the removal of particles, so that the dry ice grains from the nozzle 730 in the remover 700 gushes to the position, at which the detecting means 600 detects the particle. When the valve 775e opens, the grain supplying part 771 supplies the dry ice grains mixed with the high pressure gas by the mixing part 775 through the piping 775d, and then, the dry ice grains gush from the nozzle 770. The dry ice grains that gush from the nozzle 770 diffuses and collides with particles and surround the mask M. At this time, a force is added to the particles by hitting the dry ice grains, and the particles that secede from the mask M and are removed in accordance with the flow of the dry ice grains.

The removed particles are charged by the abratio electrification, being removed by the metal part 720A, such as a wire net, which is arranged parallel near the mask M, and can switch its charges between plus and minus at several Hz to several tens of Hz.

When plural particles exist on the mask M, the stage 630 moves so that the dry ice grains from the nozzle 770 gush to the position at which a next particle exists. The dry ice grains gush from the nozzle 770 to the mask M, removing the particles after the stage 630 moves. The removal of the particles repeats until all particles are removed from the mask M.

The high pressure gas that is gushed to the vacuum chamber 200 with the dry ice grains never influences the detection and removal of the particles, in addition to being harmless, even if the partial pressure of carbon dioxide rises in the vacuum chamber 200, because the gas is air (or, carbon dioxide) in this embodiment. Since the dry ice grains are coagulated carbon dioxide, the predetermined grains evaporate and sublime under the low or the high vacuum atmosphere, do not generate new particles, and do not adhere to the mask M.

The stage 630 may be scanned so that a pulsed laser beam from the irradiating part 710 in the remover 700, as shown in FIG. 5, is irradiated to all surfaces of the mask M, for instance, regardless of the positions of the particles that exist on the mask M, as shown in FIG. 10. As a result, the particles that exist on the mask M can be removed, even if the detecting means 600 is not necessarily arranged. Here, FIGS. 10A to 10D are schematic plan views for explaining a scanning operation of a stage 630, shown in FIG. 4.

Figure 10A:
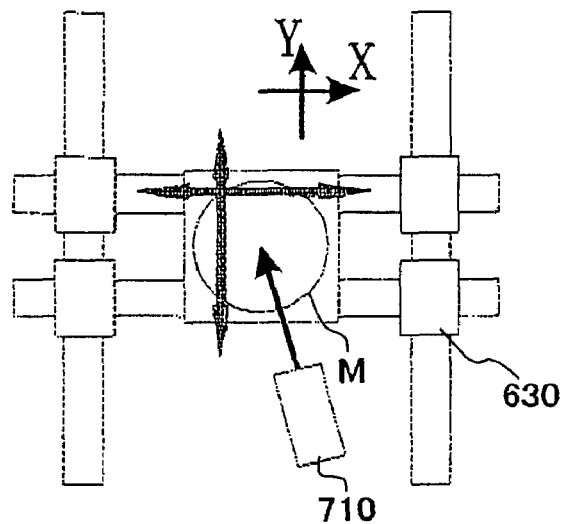
FIGS. 10A-10D are schematic plan views for explaining a scanning operation of a stage shown in FIG. 4.
Figure 10B:
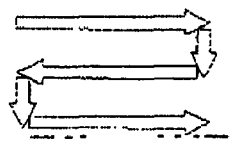

With reference to FIGS. 10A to 10D, first, the stage 630 moves so that a pulsed laser beam from the irradiating part 710 in the remover 700 is irradiated to the edge of the mask M. Next, the pulsed laser beam is irradiated onto the mask M, and stage 630 is scanned sequentially in the direction of two axes. For instance, the scan is executed to an X axial direction, as shown in FIG. 10B, and moves like a step operation with a Y axial direction at suitable intervals to be executed opposite to the X axial direction when reaching the edge X axial direction of the mask M.

Figure 10D:
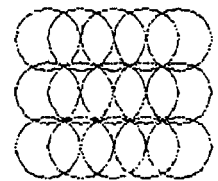
Figure 10C:
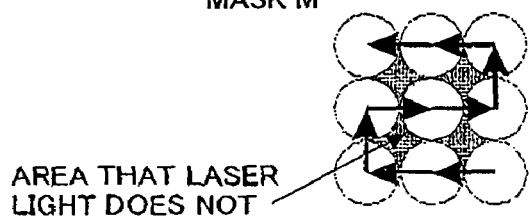

The scanning speed of the stage 630 needs to be set considering luminescence intervals of a pulsed laser beam. For instance, when the range of the irradiation of the laser beam irradiated by the irradiating part 710 in the remover 700 is about φ1 mm on the mask M, the range where the particles are removed by one luminescence becomes about φ10 mm. Here, if the irradiating part 710 emits light with 1 KHz, an area (i.e., an area where the laser beam is not irradiated is generated) where the particles are not removed is generated under the scanning speed with 10000 mm/sec in the stage 630, even if the width of the step operation changes, as shown in FIG. 10C. When the maximum of the scanning speed in the stage 630 is 5000 mm/sec and the width of the step operation is 8.5 mm, the laser beam may irradiate to all surfaces of the mask M, as shown in FIG. 10D, and the particles can be removed. The irradiating part 710 in the remover 700, shown in FIG. 5, and the nozzle 730, etc., shown in FIG. 7, may move to the positions of the particles on the mask though they move from the positions of the particles on the mask detected by the detecting means 600 to a position at which the remover 700 is arranged (i.e., it moves to the mask side). The detecting means 600 may not only move to the mask side, but also may detect the positions of the particles to move the light source 610.

FIGS. 11A to 11D are schematic plan views for explaining a scanning operation of the illumination part 710 in the remover 700, shown in FIG. 5. The irradiating part 710 in the remover 700 may execute the scanning operation in FIGS. 1A to 11D. As a result, when the particles are removed, it is not necessary to maintain the mask on the stage where the mask can be moved in the direction of the two axes in the vacuum chamber 200. The light source 610 in the detecting means 600 for detecting the particles may also execute the scanning operation, and it is not necessary to arrange the stage where the mask can be moved in the direction of two axes.

Figure 11A:
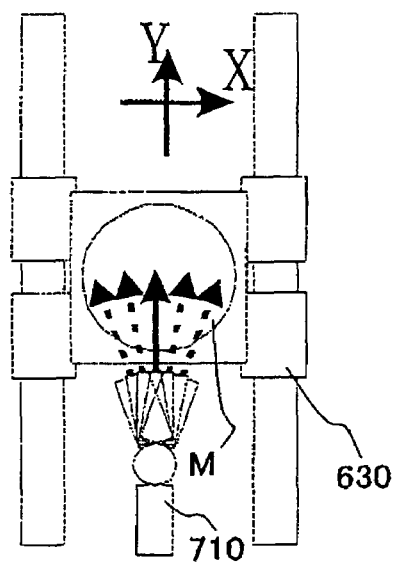
FIGS. 11A-11D are schematic plan views for explaining a scanning operation of an illumination part of a remover shown in FIG. 5.
Figure 11B:
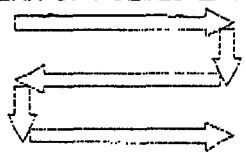

With reference to FIG. 11A, the irradiating part 710 moves so that the pulsed laser beam from the irradiating part 710 in the remover 700 is irradiated to the edge of the mask M. Next, the irradiating part 710 is scanned so that the pulsed laser beam is irradiated onto the mask M, and the laser beam is irradiated to all surfaces of the mask M. For instance, the scan is executed in the X axial direction, as shown in FIG. 11B, and moves like a step operation with the Y axial direction at suitable intervals to be executed opposite to the X axial direction when reaching the edge of the X axial direction of the mask M.

Figure 11D:
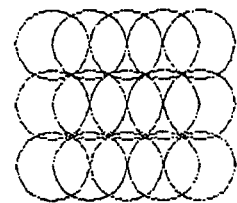
Figure 11C:
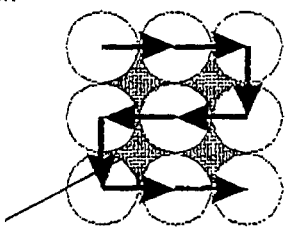

The scanning speed of the laser beam needs to be set considering luminescence intervals of a pulsed laser beam. For instance, when the range of the irradiation of the laser beam irradiated by the irradiating part 710 in the remover 700 is about $\phi 1$ mm on the mask M, the range where the particles are removed by one luminescence becomes about $\phi 10$ mm. Here, if the irradiating part 710 emits light with 1 KHz, an area (i.e., an area where the laser beam is not irradiated is generated) where the particles are not removed is generated under the scanning speed with 10000 mm/sec in the laser beam, even if the width of the step operation changes, as shown in FIG. 10C. When the maximum of the scanning speed in the laser beam is 5000 mm/sec and the width of the step operation is 8.5 mm, the laser beam may irradiate to all surfaces of the mask M, as shown in FIG. 11D, and the particles can be removed.

The irradiating part 710 in the remover 700 may moved in the X axial direction, and the mask may be held by the stage for scanning the mask to the Y axial direction. First, the irradiating part 710 and the stage move so that a pulsed laser beam from the irradiating part 710 in the remover is irradiated to the edge of the mask M. Next, the irradiating part 710 and the stage are scanned so that a pulsed laser beam is irradiated onto the mask M, and the laser beam is irradiated to all surfaces of the mask M. For instance, the scan is executed in the X axial direction, and moves like a step operation with the Y axial direction at suitable intervals based on the stage to be executed in the X axial direction, in the opposite direction when reaching the edge of the X axial direction of the mask M.

Figure 12A:
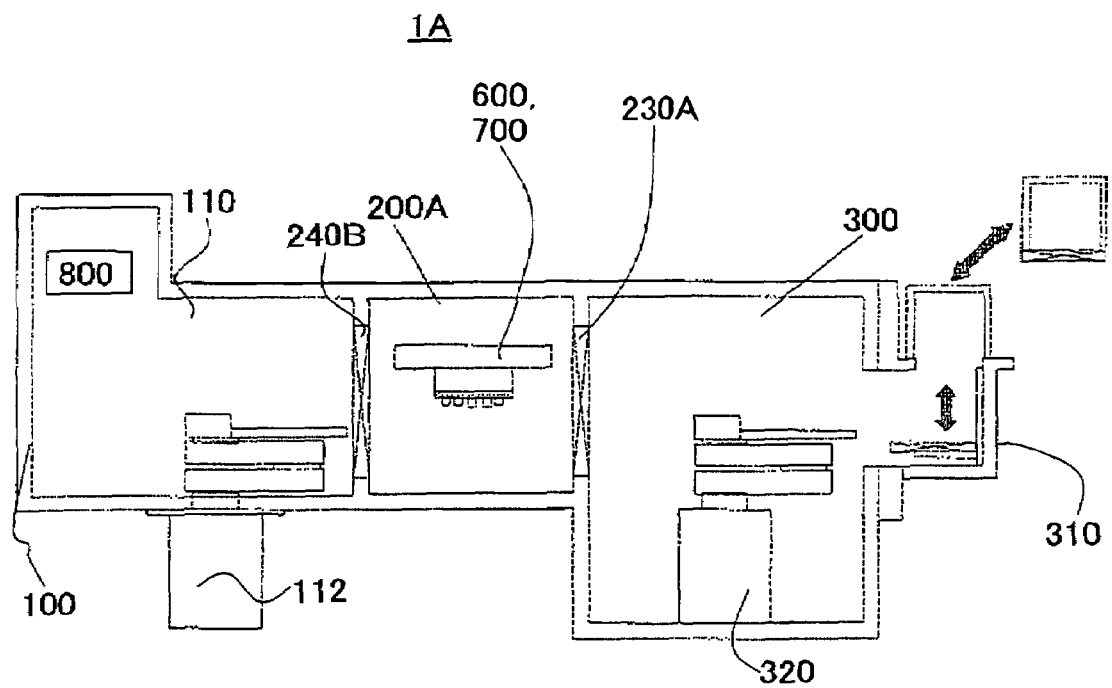
FIGS. 12A and 12B are schematic block diagrams showing a configuration of a processing system as a variation of the processing system shown in FIGS. 1A and 1B.
Figure 12B:
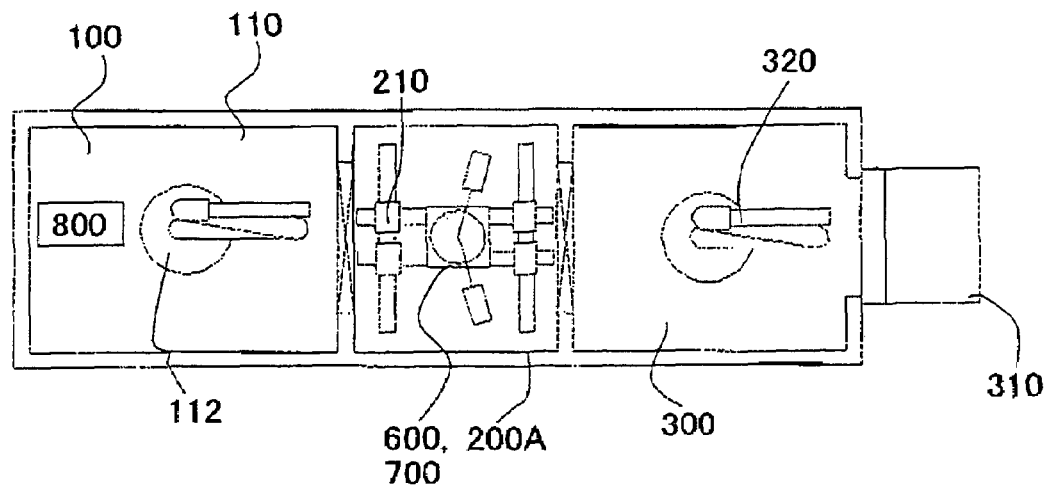

With reference to FIGS. 12A and 12B, a description will now be given of a processing system 1A as another embodiment of the processing system 1, shown in FIGS. 1A and 1B. Here, FIGS. 12A and 12B are schematic block diagrams showing a configuration of a processing system 1A as a variation of the processing system 1, shown in FIGS. 1A and 1B, in which FIG. 12A is a sectional view, and FIG. 12B is a top view. The configuration of the vacuum chamber 200A is different, though the processing system 1A is similar to the processing system 1.

The processing system 1A is arbitrarily composed so as to be able to control the pressure in the vacuum chamber 200A between the high vacuum and the ambient pressure. The vacuum chamber 200A is connected to the clean booth 300 maintained to the ambient pressure through a first gate valve 230A, and is connected to a processing chamber 100 (strictly, the reserving room 110 of the chamber) through a gate valve 240A. The second transporter 210, the first load lock chamber 400 and the second load lock chamber 500 in the system 1 are not arranged.

The vacuum chamber 200A includes a vacuum pump (not shown) that can exhaust pressure from a high vacuum atmosphere of about $1 \times 10^{-9}$ Pa. The vacuum chamber 200A also includes a gas supplying means (not shown) for supplying gas to return a vacuum atmosphere to the ambient pressure in the vacuum chamber 200A.

A description will now be given of an operation of the processing system 1A, i.e., a transportation of a mask. First, the first transporter 320 goes into the carrier mounting part 310 in the ambient atmosphere, and takes out a mask. The first transporter 320 shortens the arm to hold the mask, and confirms the state of the vacuum chamber 200A. The first transporter 320 transports the mask to the vacuum chamber 200A when the vacuum chamber 200A can receive the mask, i.e., when its inside becomes an ambient atmospheric condition and the first gate valve 430A opens. When the mask is stored in the vacuum chamber 200A, the first gate valve 230A closes for a replacement of the atmosphere.

A vacuum pump (not shown) starts exhausting the gas in the vacuum chamber 200A when the first gate valve 230A closes, and then, a vacuum-exhausting valve (not shown) opens. The vacuum-exhausting valve closes and the exhaust ends, when the vacuum chamber 200A is exhausting until a predetermined pressure is reached. The predetermined vacuum level is set to be 100 Pa or less. The pressure detecting means (not shown) confirms the pressure in the vacuum chamber 200A, and, if the pressure is within a range of predetermined pressure, the replacement of the atmosphere in the vacuum chamber 200A is completed.

A description will now be given of the replacement of the atmosphere that uses $N_2$ and He, etc., for the atmosphere gas in the vacuum chamber 200A. When the first gate valve 230A closes, the vacuum-exhausting valve (not shown) opens, and then the vacuum pump (not shown) starts exhausting the gas in the vacuum chamber 200A. The vacuum-exhausting valve closes and the exhaust ends, when the vacuum chamber 200A is exhausted to a predetermined pressure. Here, the predetermined vacuum level is determined based on the purity of the atmosphere gas of the vacuum chamber 200, and sets to much lower than the usual pressure in the vacuum chamber 200A. When the exhaust ends, the gas supplying valve (not shown) opens and then the gas supply means (not shown) supplies the predetermined atmospheric gas. When the pressure of the supplied atmospheric gas reaches the predetermined pressure, the gas supplying valve closes. The pressure detecting units (not shown) confirm pressure in the vacuum chamber 200A, and, if the pressure is within a predetermined pressure range, the replacement of the atmosphere is completed in the vacuum chamber 200A.

Next, the detecting means 600 detects the adhesions of the particles to the mask carried into vacuum chamber 200A. The detection of particle adhesions to the mask is similar to the processing system 1, and thus, a detailed explanation is omitted here.

The particles are removed when the detection of the particles ends on the entire surfaces of the mask. The removal of the particles is similar to the processing system 1, and thus, a detailed explanation is omitted here.

When the detection and removal of the particles end, the vacuum chamber 200A is vacuum-exhausted. The vacuum-exhausting valve opens with the first gate valve 230A and the second gate valve 240A shut, and the vacuum pump exhausts gas in the vacuum chamber 200A. A pressure in the vacuum chamber 200A assumed to be a target is equal to the processing chamber 100, for instance, $1\times10^{-8}$ Pa. Therefore, though a turbo-molecular pump is generally used, a vacuum pump is not specified in this embodiment, because this embodiment is not dependent upon the kind of the vacuum pump being used. The vacuum-exhausting valve closes and the exhaust ends, when the vacuum chamber 200A is exhausted to a predetermined pressure. The pressure detecting means (not shown) confirms pressure of the vacuum chamber 200A, and, if the pressure is within a range of the predetermined pressure, the replacement of the atmosphere in the vacuum chamber 200A is completed.

The second gate valve 440A opens and then the third transporter 112 goes into the vacuum chamber 200A, taking out the mask from the vacuum chamber 200A when the replacement of the high vacuum atmosphere is completed in the vacuum chamber 200A. The third transporter 112 transports the mask taken out from the vacuum chamber 200A into an exposure apparatus 800 as an exposure processing part stored in the processing chamber 100, and the exposure apparatus exposes the mask. This embodiment transports the mask to the second load lock chamber 500 after detecting and removing the particles in the vacuum chamber 200A, but the present invention is not limited to this embodiment. It is possible to again determine whether the particles exist after the particles are removed, and to transport the mask from the vacuum chamber 200A to the processing chamber 100 after determining that the particles do not exist on the mask.

The second transporter 210, for transporting the mask from the vacuum chamber 200A to the exposure apparatus 800 in the processing chamber 100, is arranged in the vacuum chamber 200A, as well as the processing system 1. Concretely, the second transporter 112 is composed so as to transport the mask to the exposure apparatus 800 in the processing chamber 100, and transports the mask from the vacuum chamber 200A to the exposure apparatus 800 after the arm of the second transporter 112 passes an opening in the second gate valve 440A. As a result, it becomes easy to maintain the high vacuum atmosphere in the processing chamber 100 because the number of materials that exist in the processing chamber 100 and the chamber reserving room 110 with the high vacuum atmosphere decreases, in addition to the fact that the third transporter 112 need not be arranged in the chamber reserving room 110, so that a component arrangement becomes simplified. In addition, the swirls of the particles by the third transporter 112 transporting the mask need not be noted.

The processing system 1 can provide high-quality exposure by detecting and removing the particles in the vacuum chamber 200A and by preventing the particles in the vacuum chamber 200A and by preventing the particles that have adhered to the mask, even if the particles adhere to the mask while transporting the mask from the carrier mounting part 210 (at the atmosphere pressure) to the vacuum chamber 200A. The particles do not easily swirl in the exhaust, etc., and the particles that have adhered to the mask can be prevented, because the atmosphere is held to a high vacuum when the mask is transported to the processing chamber 100 from the vacuum chamber 200A. The processing chamber 100 can be maintained to be small, because the vacuum chamber 200A houses the detecting means 600 and the remover 700. As a result, a long time is never required to exhaust the processing chamber 100, and good throughput is assured.

Figure 13A:
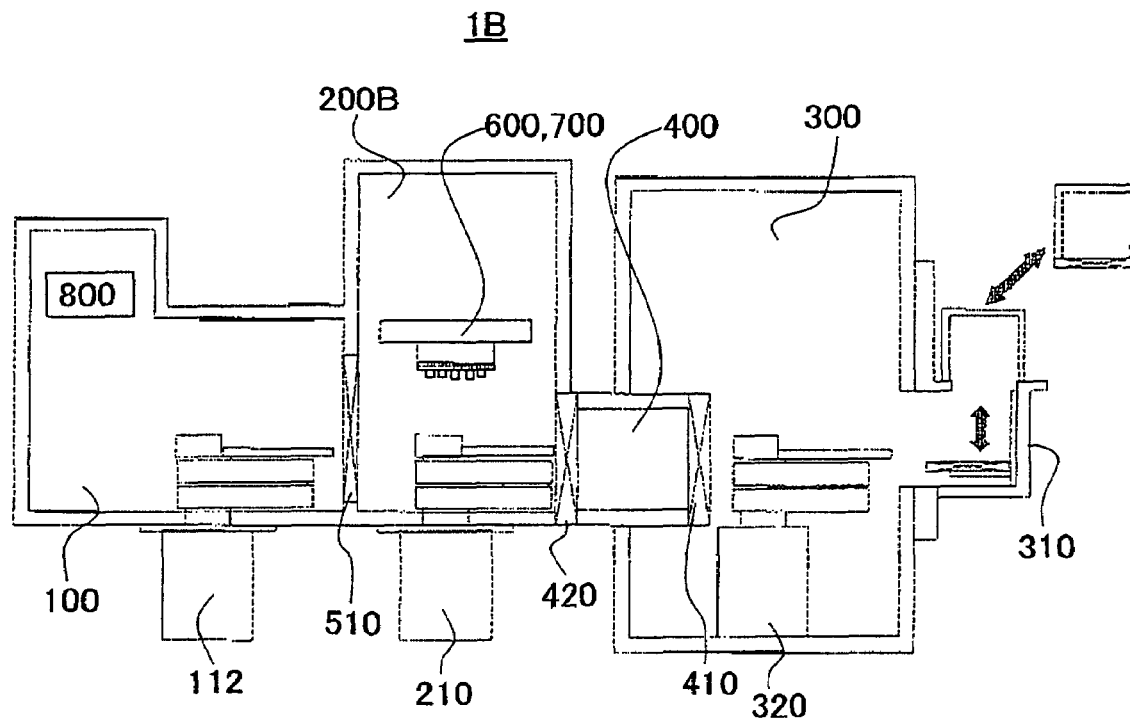
FIGS. 13A and 13B are schematic block diagrams showing a configuration of a processing system as a variation of the processing system shown in FIGS. 1A and 1B.
Figure 13B:
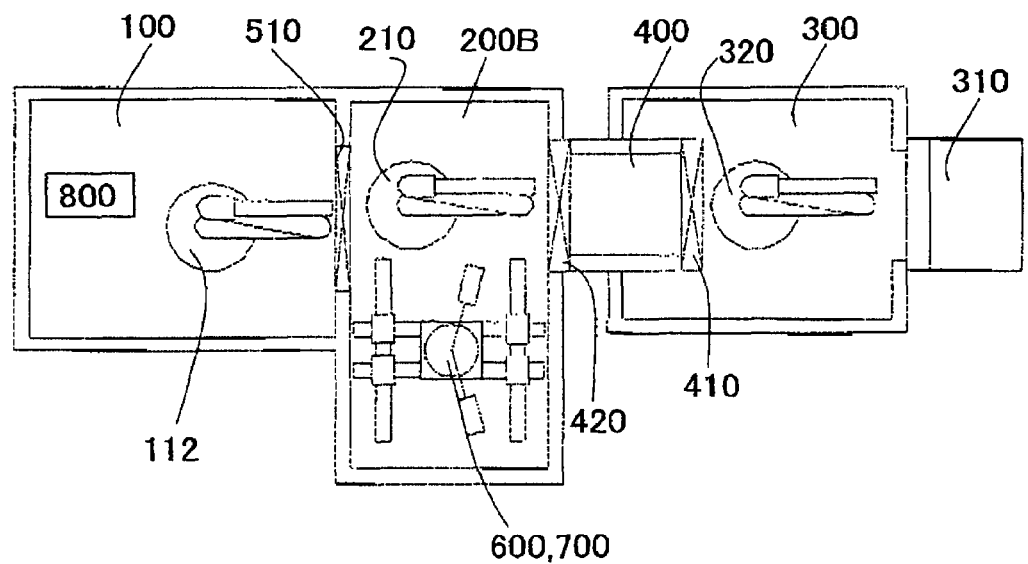

With reference to FIGS. 13A and 13B, a description will now be given of a processing system 1B as another embodiment of the processing system 1, shown in FIGS. 1A and 1B. Here, FIGS. 13A and 13B are schematic block diagrams showing a configuration of a processing system 1B as a variation of the processing system 1, shown in FIGS. 1A and 1B, in which FIG. 13A is a sectional view, and FIG. 13B is a top view.

It is different in the manner in which the second load lock chamber 500 is arranged, though the processing system 1B is similar to the processing system 1. The processing system 1A is arbitrarily composed so as to be able to control the pressure in the vacuum chamber 200A between the high vacuum and the ambient pressure.

The processing system 1B includes a vacuum chamber 200B, which is arranged near the processing chamber 100 and is maintained to the same high vacuum atmosphere as that of the processing chamber 100. The vacuum chamber 200B is connected to the processing chamber 100 through the third gate valve 510, and is connected to the first load lock chamber 400 through the second gate valve 420. The vacuum chamber 200B houses the detecting means 600 and the remover 700.

A description will now be given of an operation of the processing system 1B, i.e., a transportation of a mask. First, the first transporter 320 goes into the carrier mounting part 310 in the ambient atmosphere, and takes out a mask. The first transporter 320 shortens the arm to hold the mask, and confirms the state of the first load lock chamber 400. The first transporter 310 transports the mask to the first load lock chamber 400 when the first load lock chamber 400 can receive the mask, i.e., when its inside becomes an ambient atmospheric condition and the first gate valve 410A opens. When the mask is stored in the first load lock chamber 400, the first gate valve 410 closes for a replacement of the atmosphere.

When the first gate valve 210 closes, and then a vacuum-exhausting valve (not shown) opens, a vacuum pump (not shown) starts exhausting the gas in the first load lock chamber 400. A pressure in the first load lock chamber 400 assumed to be a target is equal to that of the processing chamber 100, for instance, $1\times10^{-8}$ Pa. Thus, a dry pump exhausts until a low vacuum atmosphere of about several Pa to several tens of Pa, switches to a turbo-molecular pump exhaust. The vacuum-exhausting valve closes and the exhaust ends, when the first load lock chamber 400 is exhausted to a predetermined pressure. The pressure detecting means (not shown) confirms pressure in the first load-lock chamber 400, and, if the pressure is within a predetermined pressure range, the replacement of the atmosphere in the first load lock chamber 400 is completed.

The second gate valve 420 opens and then, the second transporter 210 goes into the first load lock chamber 400, taking out the mask from the first load lock chamber 400 when the replacement of the atmosphere is completed in the first load lock chamber 400. The second transporter 210 finishes the transportation to the vacuum chamber 200 by supplying the mask to a mask chuck (not shown) in the vacuum chamber 200.

Next, the detecting means 600 detects adhesion of particles to the mask carried out into vacuum chamber 200B. The detection for adhesion of particles to the mask is similar to that of the processing system 1, and thus, a detailed explanation is omitted here.

The particles are removed when the detection of the particles ends on the entire surfaces of the mask. The removal of the particles is similar to that for the processing system 1, and thus, a detailed explanation is omitted here.

The second transporter 210 transports the mask on which the particles are detected and removed to the processing chamber 100. When the second transporter 210 holds the mask, the state in the vacuum chamber 100 is confirmed. The second transporter 210 transports the mask to the processing chamber 100 when the vacuum chamber 100 can receive the mask, i.e., its inside becomes a high vacuum atmosphere condition (for instance, $1\times10^{-8}$ Pa) and the third gate valve 510 opens. When the mask is stored in the processing chamber 100, the third gate valve 510 closes.

When the third gate valve 510 closes, the third transporter 112 holds the mask, transports the mask taken out from the vacuum chamber 200A into an exposure apparatus 800 as an exposure processing part stored in the processing chamber 100, and the exposure apparatus exposes the mask.

The processing system 1B can provide high-quality exposure by detecting and removing the particles in the vacuum chamber 200B and by preventing the particles that have adhered to the mask, even if the particles adhere to the mask while transporting the mask from the carrier mounting part 210 (at the atmosphere pressure) to the vacuum chamber 200B. The particles do not easily swirl in the exhaust, etc., and the particles that have adhered to the mask can be prevented, because an atmosphere is a high vacuum when the mask is transported to the processing chamber 100 from the vacuum chamber 200B. The processing chamber 100 can be maintained to be small, because the vacuum chamber 200B houses the detecting means 600 and the remover 700. As a result, a long time is never required to exhaust the processing chamber 100, and good throughput is assured.

Figure 14:
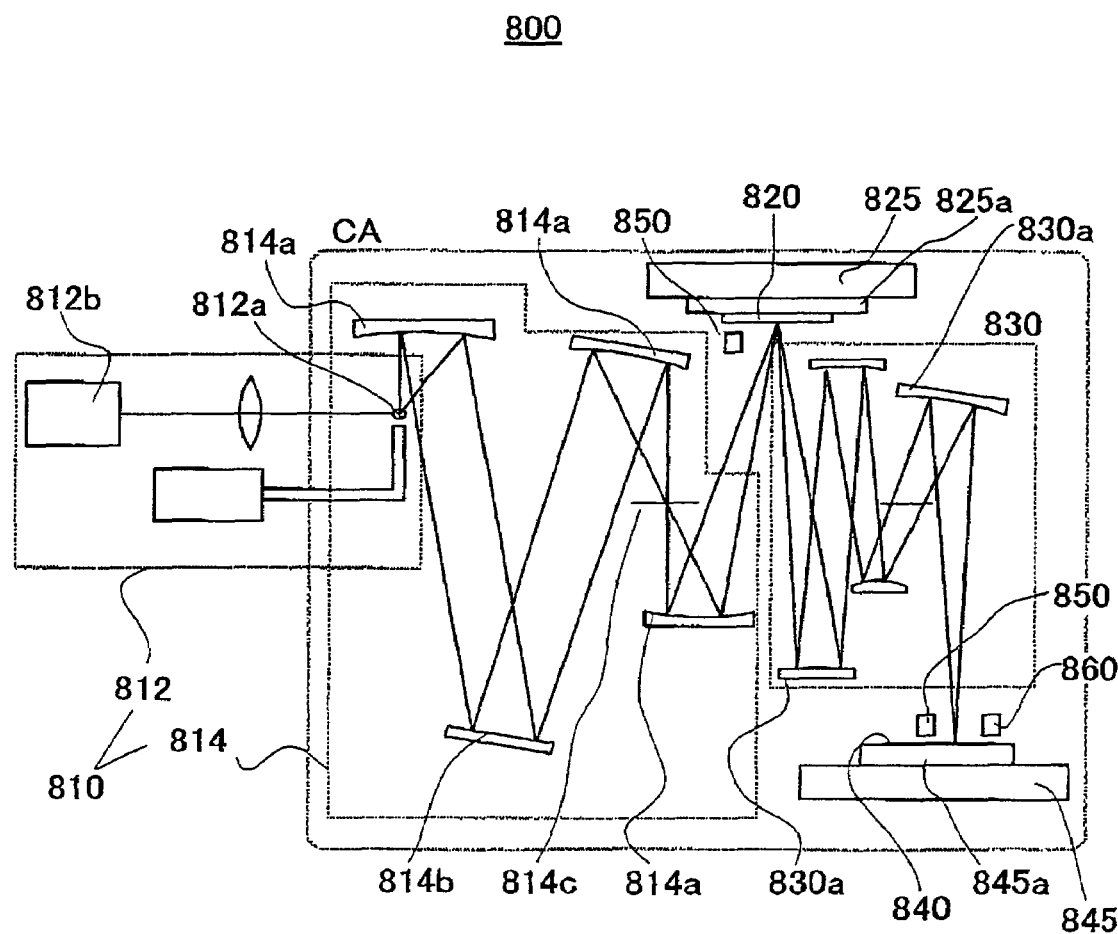
FIG. 14 is a schematic block diagram showing a configuration of an exposure apparatus shown in FIGS. 1A and 1B.

Referring now to FIG. 14, a description will now be given of an exemplary exposure apparatus 800 in a processing chamber 100 as an exposure processing part. FIG. 14 is a schematic structure of the exposure apparatus 800.

The inventive exposure apparatus 800 is a projection exposure apparatus that uses, as illumination light for exposure, EUV light (e.g., with a wavelength of 13.4 nm) to perform a step-and-scan or step-and-repeat exposure that transfers a circuit pattern on a mask 820 onto an object 840 to be exposed. Such an exposure apparatus is suitably applicable to a lithography process below a submicron or quarter-micron, and a description will now be given below of this embodiment, exemplarily using a step-and-scan exposure apparatus (which is also called "a scanner"). The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of an exposure method that moves a wafer stepwise to an exposure area for the next shot for every shot of cell projection onto the wafer.

The exposure apparatus 800 includes, as shown in FIG. 14, an illumination apparatus 810, the mask 820, a mask stage 825 that mounts the mask 820, a projection optical system 830, the object 840, and a wafer stage 848 that mounts the object 840, an alignment detection mechanism 850, and a focus position detecting mechanism 860.

As shown in FIG. 8, at least the optical path through which the EUV light travels (or the entire optical system) should preferably be maintained in a vacuum atmosphere CA, since the EUV light has low transmittance to the air and causes contaminations as a result of a response to components of residual gas (for polymer organic gas).

The illumination apparatus 810 uses arc EUV light corresponding to an arc field in the projection optical system 830, to illuminate the mask 820, and includes an EUV light source 812 and an illumination optical system 814.

The EUV light source 812 uses, for example, a laser plasma light source. The laser plasma light source 812b irradiates, as a highly intensified pulse, a laser beam to a target material 812a put in a vacuum, thus generating high-temperature plasma for use as EUV light with a wavelength of about 13.4 nm emitted from this. The EUV light source 812 may use an electrical discharge plasma light source. However, the EUV light source 812 is not limited to the one above, and can use any structure known in the art.

The illumination optical system 814 includes condenser mirrors 814a and an optical integrator 814b. The condenser mirror 814a condenses EUV light that is radiated approximately isotropically from the laser plasma light source. The optical integrator 814b uniformly irradiates the mask 820 with a predetermined numerical aperture. The illumination optical system 814 further includes an aperture 814c at a position conjugate with the mask 820, which limits an illumination area of the mask 820 to an arc shape.

The mask 820 is a reflection reticle, and forms, on a mirror, a circuit pattern (or image) to be transferred. The mask 820 is supported and driven by a mask stage 825. The diffracted light emitted from the mask 820 is projected onto the object 840 after being reflected by the projection optical system 830. The mask 820 and object 840 are arranged optically conjugate with each other. Since the exposure apparatus 800 of this embodiment is a scanner, the mask 820 and object 840 are scanned to project a reduced size of a pattern on the mask 820, onto the object 840.

The mask stage 825 supports the mask 820 through chuck 825a, and is connected to a moving mechanism (not shown). The mask stage 825 can use any structure known in the art. The moving mechanism (not shown) includes a linear motor, etc., and moves the mask 820 by driving the mask stage 825 at least in an X direction. The exposure apparatus 800 scans the mask 820 and the object 840 synchronously. Here, the X is a scan direction on the mask 820 or the object 840, the Y is a direction perpendicular to it, and the Z is a perpendicular direction on the surface of mask 820 or the object 840.

The projection optical system 830 uses plural multilayer mirrors 830a to project a reduced size of a pattern formed on the mask 820 onto the object 840 at an image surface. The number of mirrors 830a is about four to six. For a wide exposure area with a small number of mirrors, the mask 820 and the object 840 are simultaneously scanned to transfer a wide area that is an arc-shaped area or a ring field apart from the optical axis by a predetermined distance.

The object 840 is a wafer in the instant embodiment, but may cover any object to be exposed, such as an LCD, and a photoresist is applied to the object 840. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming processing so as to enhance the adhesion between the photoresist and a base (i.e., a process to increase the hydrophobicity by applying a surface active agent), through a coat or vaporous process using an organic film, such as HMDS (Hexamethyl-disilazane). The pre-bake treatment is a baking (or burning) step, softer than that after development, which removes the solvent. The above processing system 1-1B may transport the object 840, and thus, may expose with high quality by prohibiting the adhesions of the particles.

The object 804 is supported by the wafer stage 845 through a wafer chuck 845a. The wafer stage 845 uses, for example, a linear motor to move the object 840 in the X-Y-Z directions. The mask 820 and object 840 are scanned synchronously, and the positions of the mask stage 825 and wafer stage 845 are monitored, for example, by a laser interferometer, and the like, so that both are driven at a constant speed ratio.

The alignment detection mechanism 850 measures positional relationships between the mask 820 and the optical axis of the projection optical system 830, and between the object 840 and the optical axis of the projection optical system 830, and sets positions and angles of the mask stage 825 and the wafer stage 845, so that a projected image of the mask 820 accords with a predetermined position on the object 840.

The focus position detection mechanism 860 measures a focus position of the object 804 in a direction Z, controls a position and an angle of the wafer stage 845, and always maintains a surface of the object 840 at an image position by the projection optical system 830 during exposure.

In exposure, the EUV light emitted from the illumination apparatus 810 irradiates the mask 820, and images a pattern of the surface of the mask 820 onto the surface of the object 840. The instant embodiment uses an arc or ring-shaped image plane, scans the reticle 820 and object 840 at a speed ratio corresponding to a reduction ratio to expose the entire surface of the reticle 820. Since using the mask and/or the object transported by the processing system 1-1B, the exposure apparatus 800 prohibits the adhesions of the particles, and can provide devices, such as semiconductor devices, LCD devices, image pickup devices (e.g., CCDS), and thin-film magnetic heads, with excellent resolution, throughput, and economic efficiency.

Figure 15A:
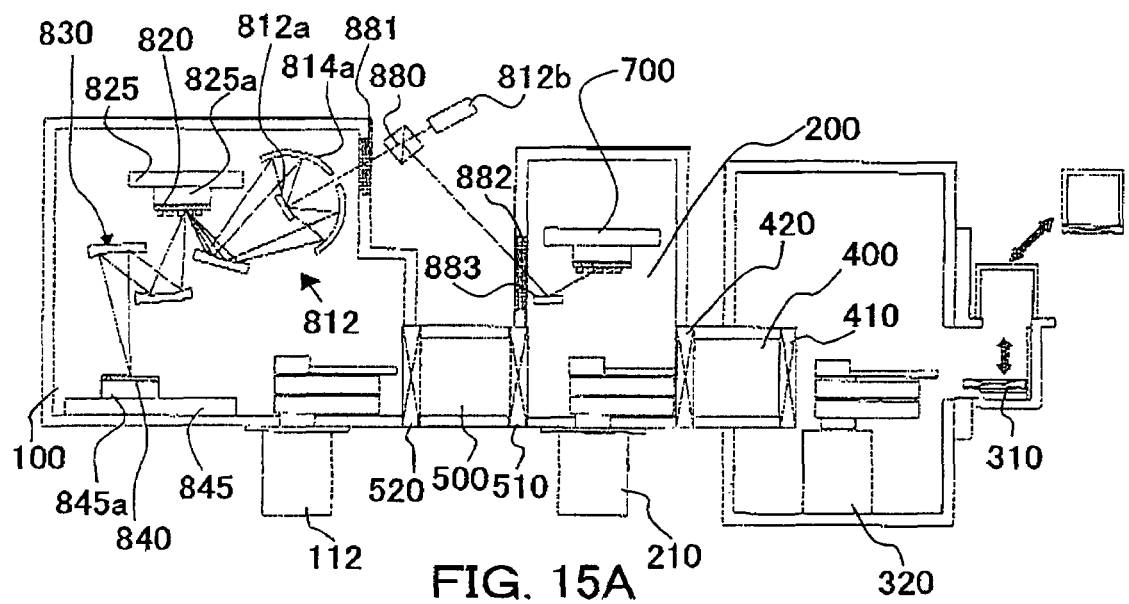
FIGS. 15A and 15B are schematic block diagrams showing a configuration of a processing system using a laser beam for a remover, from an EUV light source in the exposure apparatus shown in FIG. 14.
Figure 15B:
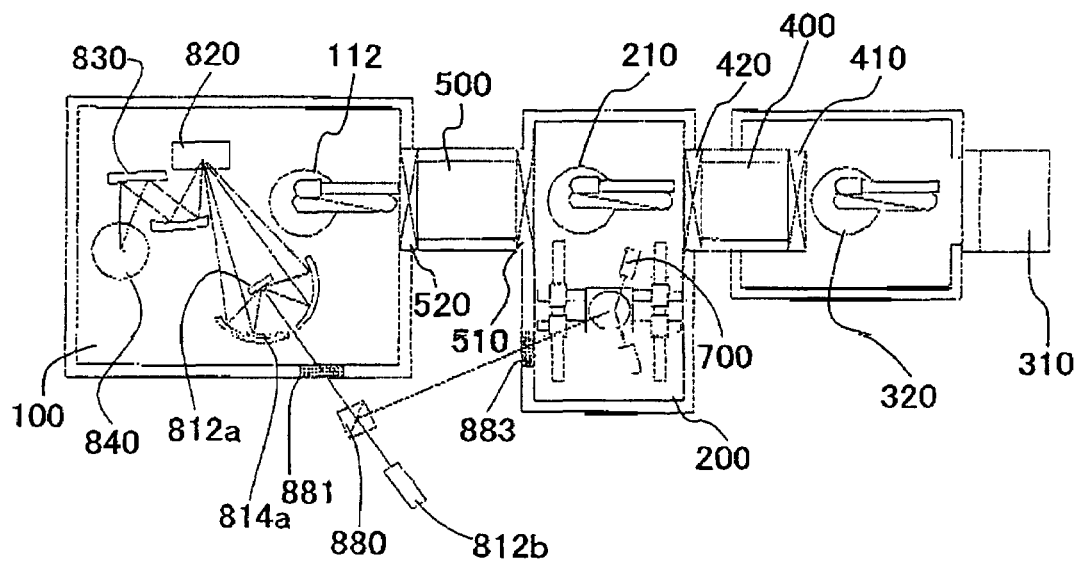

The exposure apparatus 800, as shown in FIGS. 15A and 15B, may use a remover 700 for removing the particles that have adhered to the mask after the laser beam source 812b in the EUV light source part 812 diverges the emitted pulsed laser beam. Here, FIGS. 15A and 15 are schematic block diagrams showing a configuration of a processing system 1 using a laser beam from EUV light source 812 in the exposure apparatus 800, shown in FIG. 14, as a remover 700, in which FIG. 15A is a sectional view, and FIG. 15B is a top view.

It is a principle of the EUV light source that the pulse laser beam from the laser beam source 812b is irradiated to the target 812a, the target 812a becomes plasma with a high temperature, and EUV light emitted from the plasma is used.

The target material 812a is arranged in the processing chamber 100. The target material 812a is a metallic thin film, inert gas, and a droplet, etc., and is supplied into the processing chamber 100 by a gas jet, etc. A slug, as the target material 812a, is arranged in FIGS. 15A and 15B for simplification of the explanation, though the mechanism that uses and winds a metal on a tape in accordance with the irradiation of a laser beam might actually be used. However, a kind of target material 812a and the configuration of the supplying means for supplying the target material 812a, etc., can be arbitrarily selected.

The laser beam source 312b, for changing the target material 812a into plasma, generally uses a YAG laser. The YAG laser is a solid laser using a YAG crystal as a laser medium, and emits by that excitation light of a flashlamp is irradiated and absorbed by the YAG crystal. The repetition frequency of the pulsed laser should be high to raise the average strength of the radiated EUV light, and the laser beam source 812b is usually executed with the repetition frequency of several kHz.

First, the laser beam source 812b emits for generating a laser beam. The splitter 880 divides the laser beam in two directions. One laser beam introduces into the processing chamber 100 through an introducing window 881. Though the EUV light source part 812 in FIGS. 15A and 15B is arranged in the processing chamber, the EUV light source part 812 might be stored in a chamber arranged beside the processing chamber 100 because a vacuum level actually demanded in the exposure apparatus 800 is different.

The laser beam led in the processing chamber 100 through the introduction window 881 is irradiated to the target material 812a. The target material 812a receives energy by the laser beam, becomes plasma by being excited, and emits EUV light including a wavelength of 13.4 nm. The emitted EUV light condenses to a first grade condenser mirror 814a of the illumination optical system 814, irradiates to the mask 820, and projects a pattern of the mask 820 onto the object 840 through the projection optical system 830.

On the other hand, the other laser beam divided by the beam splitter 881 is introduced from an introduction window 882 arranged in the vacuum chamber 200 to the vacuum chamber 200. The introduced laser beam travels to the remover 700 through an inducement mirror 883.

Thus, the irradiation part 710 where the laser beam is shot need not even be arranged in the remover 700 arranged by the vacuum chamber 200, according to the configuration of the processing system 1, shown in FIGS. 15A and 15B. Therefore, the vacuum chamber 200 can be exhausted within a short time by reducing the material arranged in the vacuum chamber 200 becoming possible, and preventing the vacuum chamber 200 from being enlarged.

Figure 16:
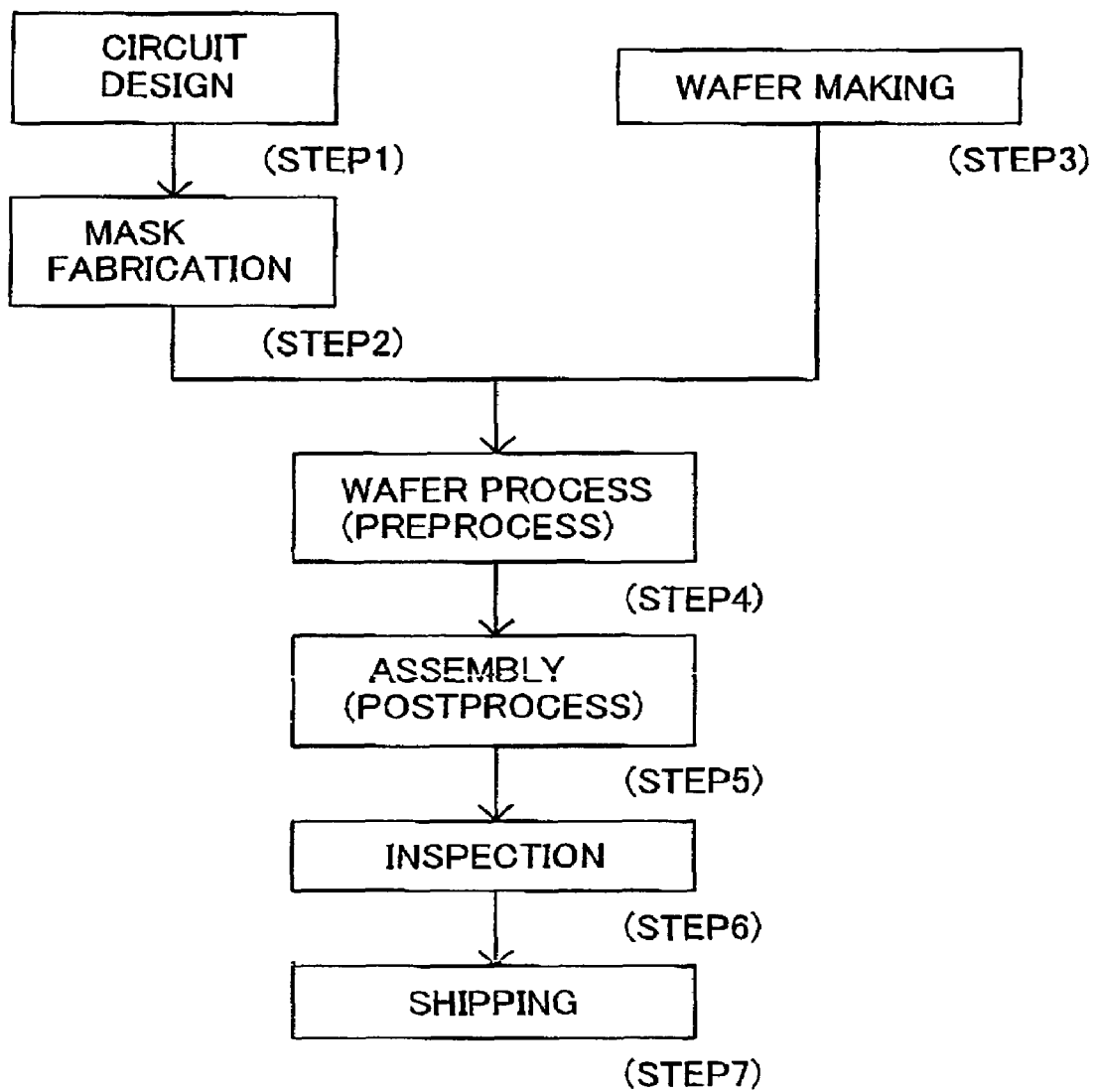
FIG. 16 is a flowchart for explaining a fabrication of devices (i.e., semiconductor chips, such as ICs and LSIs, LCDs, CCDs, etc.).
Figure 17:
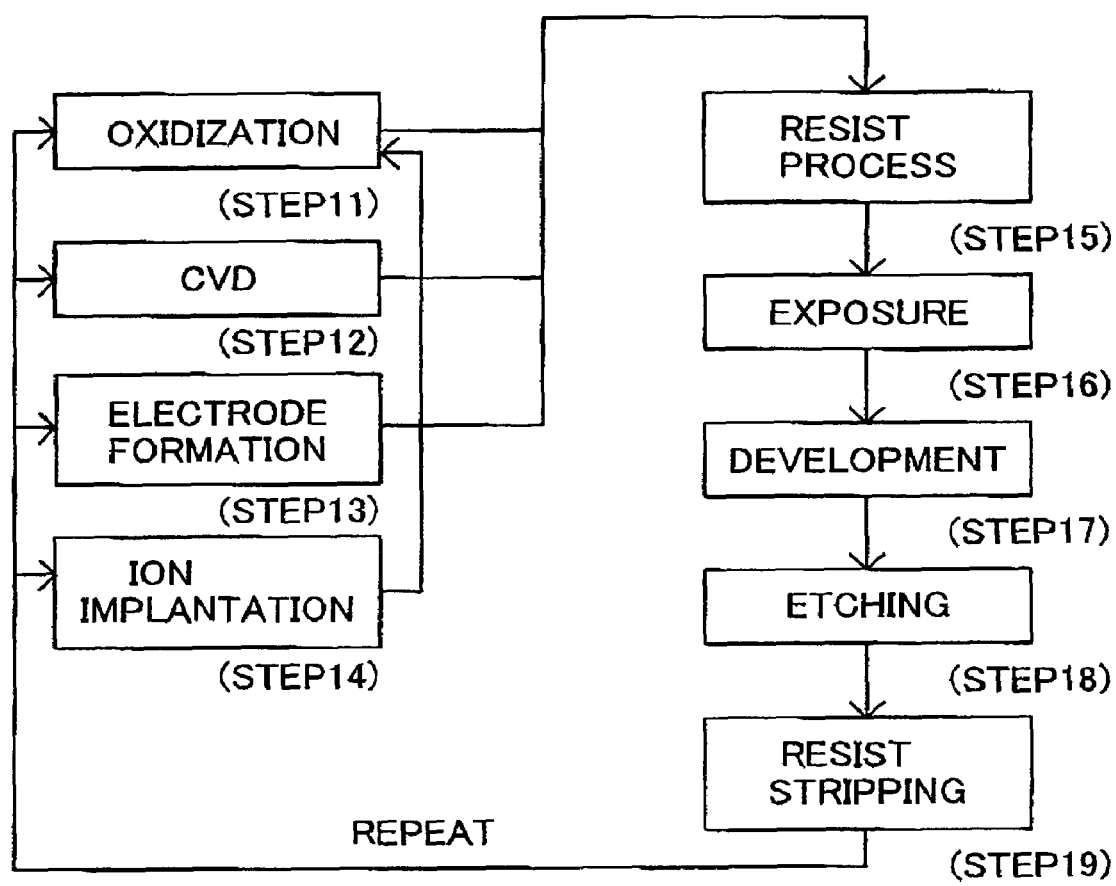
FIG. 17 is a detailed flowchart for explaining step 4 shown in FIG. 16.
Figure 18A:
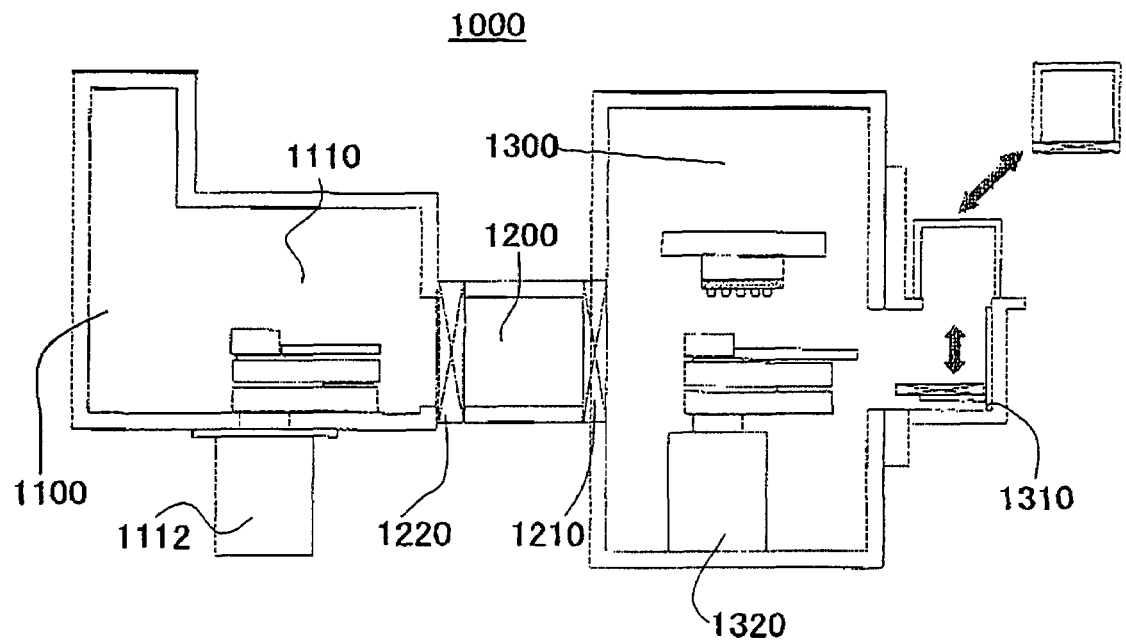
FIGS. 18A and 18B are schematic block diagrams showing a configuration of a conventional processing system.
Figure 18B:
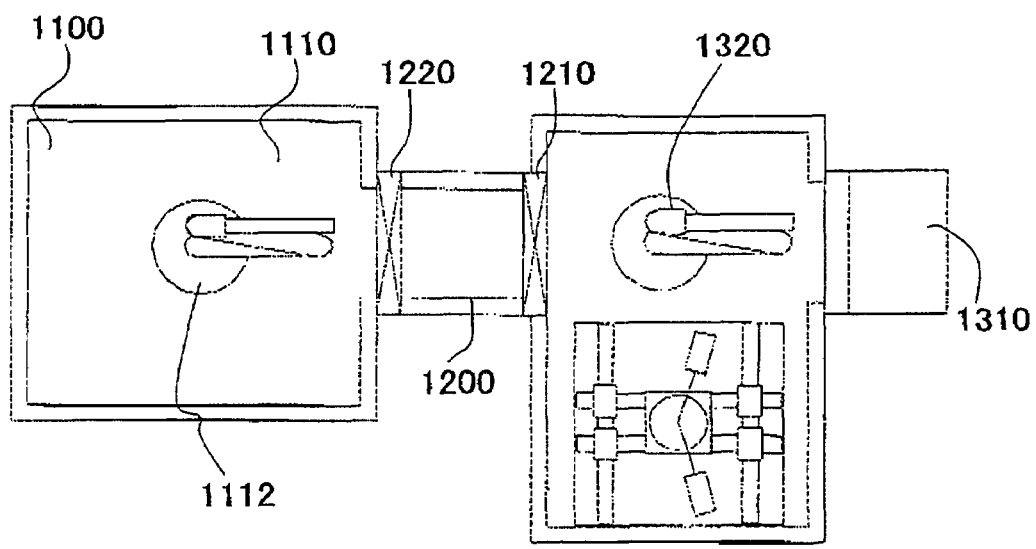

Referring to FIGS. 16 and 17, a description will now be given of an embodiment of a device fabricating method using the above processing system 1-1B (the exposure apparatus 800). FIG. 16 is a flowchart for explaining a fabrication of devices (i.e., semiconductor chips, such as ICs and LSIs, LCDs, CCDs, etc.). Here, a description will now be given of a fabrication of a semiconductor chip, as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 17 is a detailed flowchart of the wafer process shown in Step 4. Step 11 (oxidation) oxidizes the surface of the wafer. Step 12 (CVD) forms an insulating film on the surface of the wafer. Step 13 (electrode formation) forms electrodes on the wafer by vapor deposition, and the like. Step 14 (ion implantation) implants ions into the wafer. Step 15 (resist process) applies a photosensitive material onto the wafer. Step 16 (exposure) uses the exposure apparatus 500 to expose a circuit pattern on the mask onto the wafer. Step 17 (development) develops the exposed wafer. Step 18 (etching) etches parts other than a developed resist image. Step 19 (resist stripping) removes unused resist after etching. These steps are repeated, and multilayer circuit patterns are formed on the wafer. The device fabrication method of the instant embodiment may manufacture higher quality devices than does the prior art. In this manner, the device fabricating method that uses such a processing system 1-1B (an exposure apparatus 800), and the device as a final product, serve as other aspects according to the present invention.

Further, the present invention is not limited to these preferred embodiments, but various modifications and variations may be made without departing from the spirit and scope of the present invention. For example, the present invention is applicable to a processing system that includes an exposure apparatus with ultraviolet light as exposure light, or another processing system.

This invention can provide a processing system that assures throughput and executes high-quality processing by decreasing adhesion of particles to the object, and an exposure apparatus using the processing system.

What is claimed is:

1. An exposure apparatus for executing an exposure of a substrate to light via a mask, the apparatus comprising:
   a booth configured to store the mask in an atmospheric pressure;
   a processing chamber in which the exposure is executed in a first vacuum pressure;
   a vacuum chamber arranged between the booth and the processing chamber and configured to store the mask at a second vacuum pressure between 0.1 Pa and 100 Pa, the second vacuum pressure being higher than the first vacuum pressure, wherein the vacuum chamber includes a remover configured to remove a particle that adheres to the mask, and an absorber that includes a wire net of which a charge is alternately switched between plus and minus to adsorb the particle removed by the remover;
   a first load lock chamber arranged between the booth and the vacuum chamber, through which the mask is transferred, in which the atmospheric pressure and the second vacuum pressure are replaceable; and
   a second load lock chamber arranged between the vacuum chamber and the processing chamber, through which the mask is transferred, in which the second vacuum pressure and the first vacuum pressure are replaceable.

2. The apparatus according to claim 1, wherein the vacuum chamber includes a transporter configured to transport the mask between the first load lock chamber and the second load lock chamber.

3. The apparatus according to claim 1, wherein the remover is configured to remove the particle by using a pulsed laser beam.

4. The apparatus according to claim 3, wherein the remover includes an illuminator configured to illuminate the mask with the pulsed laser beam.

5. The apparatus according to claim 3, wherein the remover includes:
   an illuminator configured to illuminate the mask with the pulsed laser beam,
   the illuminator including a mirror configured to reflect the pulsed laser beam to the mask.

6. The apparatus according to claim 1, wherein the remover is configured to burn the particle by a microwave or an infrared ray.

7. The apparatus according to claim 1, wherein the remover is configured to remove the particle by spraying grains onto the mask, wherein the grains are grains obtained by coagulating gas.

8. The apparatus according to claim 7, wherein the grains include grains obtained by coagulating carbon dioxide.

9. The apparatus according to claim 2, wherein the transporter includes a shield configured to shield an adhesion of a particle to the mask.

10. The apparatus according to claim 9, wherein the shield is configured to shield the adhesion using a heat migrating force.

11. An exposure apparatus for executing an exposure of a substrate to light via a mask, the apparatus including:
    a booth configured to store the mask in an atmospheric pressure;
    a processing chamber in which the exposure is executed in a first vacuum pressure;
    a vacuum chamber arranged between the booth and the processing chamber and configured to store the mask at a second vacuum pressure between 0.1 Pa and 100 Pa, the second vacuum pressure being higher than the first vacuum pressure, wherein the vacuum chamber includes a remover configured to remove a particle that adheres to the mask, and an absorber that includes a wire net of which a charge is alternately switched between plus and minus to adsorb the particle removed by the remover;
    a first load lock chamber arranged between the booth and the vacuum chamber, through which the mask is transferred, in which the atmospheric pressure and the second vacuum pressure are replaceable; and
    a second load lock chamber arranged between the vacuum chamber and the processing chamber, through which the mask is transferred, in which the second vacuum pressure and the first vacuum pressure are replaceable.

12. An exposure apparatus for executing an exposure of a substrate to light via a mask, the apparatus comprising:
    a booth configured to store the mask in an atmospheric pressure;
    a processing chamber in which the exposure is executed in a first vacuum pressure;
    a vacuum chamber arranged between the booth and the processing chamber and configured to store the mask at a second vacuum pressure between 0.1 Pa and 100 Pa, the second vacuum pressure being higher than the first vacuum pressure, wherein the vacuum chamber includes a remover configured to remove a particle that adheres to the mask, and an absorber that includes a wire net of which a charge is alternately switched between plus and minus to adsorb the particle removed by the remover;
    a first load lock chamber arranged between the booth and the vacuum chamber, through which the mask is transferred, in which the atmospheric pressure and the second vacuum pressure are replaceable; and
    a second load lock chamber arranged between the vacuum chamber and the processing chamber, through which the mask is transferred, in which the second vacuum pressure and the first vacuum pressure are replaceable.

13. A method of manufacturing a device using an exposure apparatus for executing an exposure of a substrate to light via a mask, the apparatus comprising:
    (i) a booth configured to store the mask in an atmospheric pressure;
    (ii) a processing chamber in which the exposure is executed in a first vacuum pressure;
    (iii) a vacuum chamber arranged between the booth and the processing chamber and configured to store the mask at a second vacuum pressure between 0.1 Pa and 100 Pa, the second vacuum pressure being higher than the first vacuum pressure, wherein the vacuum chamber includes a remover configured to remove a particle that adheres to the mask, and an absorber that includes a wire net of which a charge is alternately switched between plus and minus to adsorb the particle removed by the remover;
    (iv) a first load lock chamber arranged between the booth and the vacuum chamber, through which the mask is transferred, in which the atmospheric pressure and the second vacuum pressure are replaceable; and (v) a second load lock chamber arranged between the vacuum chamber and the processing chamber, through which the mask is transferred, in which the second vacuum pressure and the first vacuum pressure are replaceable, the method comprising:
(a) exposing the substrate to light via the mask using the exposure apparatus;
(b) developing the exposed substrate; and
(c) processing the developed substrate to manufacture the device.

14. A method of manufacturing a device using an exposure apparatus for executing an exposure of a substrate to light via a mask, the apparatus comprising:

(i) a booth configured to store the mask in an atmospheric pressure;
(ii) a processing chamber in which the exposure is executed in a first vacuum pressure;
(iii) a vacuum chamber arranged between the booth and the processing chamber and configured to store the mask at a second vacuum pressure between 0.1 Pa and 100 Pa, the second vacuum pressure being higher than the first vacuum pressure, wherein the vacuum chamber includes a remover configured to remove a particle that adheres to the mask, and an absorber that includes a wire net of which a charge is alternately switched between plus and minus to adsorb the particle removed by the remover;

(iv) a first load lock chamber arranged between the booth and the vacuum chamber, through which the mask is transferred, in which the atmospheric pressure and the second vacuum pressure are replaceable; and (v) a second load lock chamber arranged between the vacuum chamber and the processing chamber, through which the mask is transferred, in which the second vacuum pressure and the first vacuum pressure are replaceable, wherein the vacuum chamber includes a transporter configured to transport the mask between the first load lock chamber and the second load lock chamber, the transporter including a shield configured to shield an adhesion of a particle to the mask, the method comprising:
(a) exposing the substrate to light via the mask using the exposure apparatus;
(b) developing the exposed substrate; and
(c) processing the developed substrate to manufacture the device.

* * * * *